United States Patent
Sato et al.

(10) Patent No.: US 10,090,475 B2
(45) Date of Patent: Oct. 2, 2018

(54) ORGANIC ELECTROLUMINESCENT DEVICE

(71) Applicant: SAMSUNG DISPLAY CO., LTD., Yongin, Gyeonggi-Do (KR)

(72) Inventors: Shuri Sato, Yokohama (JP); Xiulan Jin, Yokohama (JP)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 404 days.

(21) Appl. No.: 14/837,655

(22) Filed: Aug. 27, 2015

(65) Prior Publication Data

US 2016/0099417 A1    Apr. 7, 2016

(30) Foreign Application Priority Data

Oct. 6, 2014 (JP) ................ 2014-205502
Oct. 6, 2014 (JP) ................ 2014-205508

(51) Int. Cl.
  *H01L 51/00*    (2006.01)
  *H01L 51/50*    (2006.01)

(52) U.S. Cl.
  CPC ........ *H01L 51/0061* (2013.01); *H01L 51/006* (2013.01); *H01L 51/0058* (2013.01);
  (Continued)

(58) Field of Classification Search
  None
  See application file for complete search history.

(56) References Cited

U.S. PATENT DOCUMENTS 8,941,297 B2    1/2015 Kaiser et al.
9,472,767 B2    10/2016 Im et al.
(Continued)

FOREIGN PATENT DOCUMENTS

CN    102201432 A    9/2011
EP    2 148 909 A2    2/2010
(Continued)

OTHER PUBLICATIONS

Chinese examination report dated Jul. 18, 2018 from the Chinese Patent Office in respect of the Chinese Patent Application 201510644911.2.

*Primary Examiner* — Gregory D Clark
(74) *Attorney, Agent, or Firm* — Lee & Morse, P.C.

(57) ABSTRACT

An organic electroluminescent device including an anode; an emission layer; an anode-side hole transport layer between the anode and the emission layer, the anode-side hole transport layer including an anode-side hole transport material, and being doped with an electron accepting material; an intermediate hole transport material layer between the anode-side hole transport layer and the emission layer, the intermediate hole transport material layer including an intermediate hole transport material; and an emission layer-side hole transport layer between the intermediate hole transport material layer and the emission layer and adjacent to the emission layer, the emission layer-side hole transport layer including an emission layer-side hole transport material represented by the following General Formula (1):

11 Claims, 1 Drawing Sheet

(52) U.S. Cl.
CPC ...... *H01L 51/0072* (2013.01); *H01L 51/0073* (2013.01); *H01L 51/0074* (2013.01); *H01L 51/506* (2013.01); *H01L 51/5064* (2013.01)

(56) References Cited

U.S. PATENT DOCUMENTS

| | | | |
|---|---|---|---|
| 2006/0170337 A1* | 8/2006 | Lee | C09K 11/06 313/504 |
| 2012/0302762 A1 | 11/2012 | Osaka et al. | |
| 2015/0270506 A1 | 9/2015 | Voges et al. | |

FOREIGN PATENT DOCUMENTS

| | | |
|---|---|---|
| JP | 2002-241352 A | 8/2002 |
| JP | 2004-339066 A | 12/2004 |
| JP | 2011-187959 A | 9/2011 |
| JP | 2013-522864 A | 6/2013 |
| KR | 10-2013-0007159 A | 1/2013 |
| KR | 10-2013-0098229 A | 9/2013 |
| KR | 10-2013-0106255 A | 9/2013 |
| WO | WO 2007/105906 A1 | 9/2007 |
| WO | WO 2014/056565 A1 | 4/2014 |

\* cited by examiner

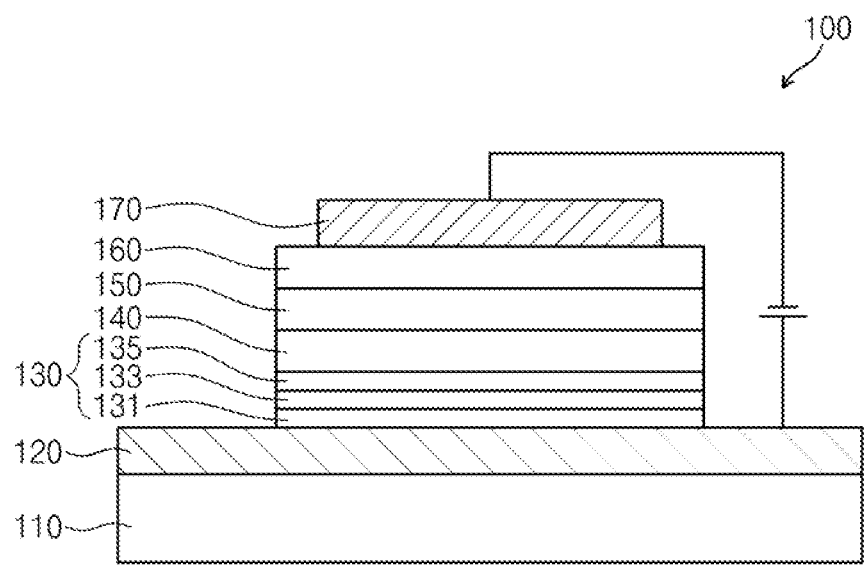

ORGANIC ELECTROLUMINESCENT DEVICE

CROSS-REFERENCE TO RELATED APPLICATIONS

Japanese Patent Application No. 2014-205502, filed on Oct. 6, 2014, in the Japanese Intellectual Property Office, and entitled: "Organic Electroluminescent Device," and Japanese Patent Application No. 2014-205508, filed on Oct. 6, 2014, in the Japanese Intellectual Property Office, and entitled: "Organic Electroluminescent Device," are incorporated by reference herein in its entirety.

BACKGROUND

1. Field

Embodiments relate to an organic electroluminescent device.

2. Description of the Related Art

The development of an organic electroluminescent display is being conducted.

For example, the development of an organic electroluminescent device which is a self-luminescent type device used in the organic electroluminescent display is also being actively conducted.

As the structure of the organic electroluminescent device, a stacked structure may be obtained by stacking e.g. an anode, a hole transport layer, an emission layer, an electron transport layer, and a cathode one by one.

In such an organic electroluminescent device, holes and electrons injected from the anode and the cathode recombine in the emission layer to generate excitons. For example, light emission may be realized via the transition of the generated excitons to a ground state.

SUMMARY

Embodiments are directed to an organic electroluminescent device.

The embodiments may be realized by providing an organic electroluminescent device including an anode; an emission layer; an anode-side hole transport layer between the anode and the emission layer, the anode-side hole transport layer including an anode-side hole transport material, and being doped with an electron accepting material; an intermediate hole transport material layer between the anode-side hole transport layer and the emission layer, the intermediate hole transport material layer including an intermediate hole transport material; and an emission layer-side hole transport layer between the intermediate hole transport material layer and the emission layer and adjacent to the emission layer, the emission layer-side hole transport layer including an emission layer-side hole transport material represented by the following General Formula (1):

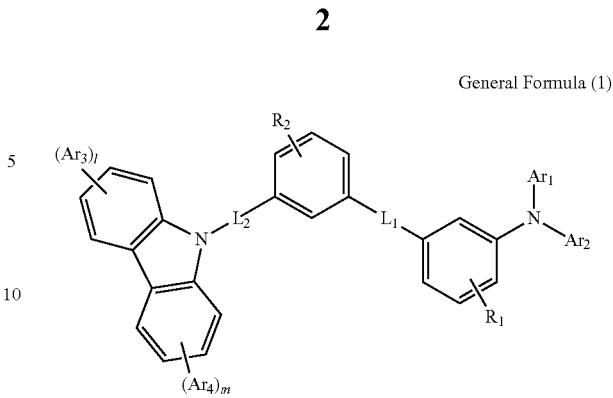

General Formula (1)

wherein, in General Formula (1), $Ar_1$ and $Ar_2$ are each independently a substituted or unsubstituted aryl group having 6 to 50 ring carbon atoms or a substituted or unsubstituted heteroaryl group having 5 to 50 ring carbon atoms, $Ar_3$ and $Ar_4$ are each independently a substituted or unsubstituted aryl group having 6 to 50 ring carbon atoms, a substituted or unsubstituted heteroaryl group having 5 to 50 ring carbon atoms, or a condensed polycyclic group formed via condensation with an adjacent ring, $R_1$ and $R_2$ are each independently a hydrogen atom, a deuterium atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, $L_1$ and $L_2$ are each independently a single bond, a substituted or unsubstituted arylene group having 6 to 18 ring carbon atoms, or a substituted or unsubstituted heteroarylene group having 5 to 15 ring carbon atoms, and l and m are each independently an integer of 0 to 4.

The intermediate hole transport material may include a compound represented by the following General Formula (2):

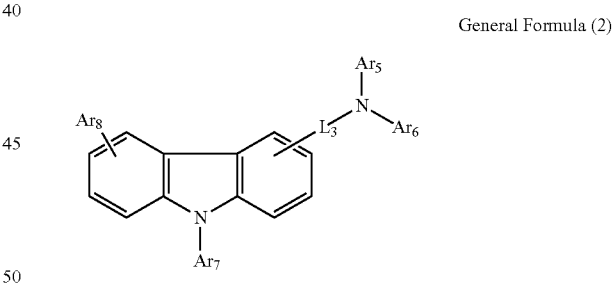

General Formula (2)

wherein, in General Formula (2), $Ar_5$ to $Ar_7$ are each independently a substituted or unsubstituted aryl group having 6 to 50 ring carbon atoms or a substituted or unsubstituted heteroaryl group having 5 to 50 ring carbon atoms, $Ar_8$ is a hydrogen atom, a deuterium atom, a halogen atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, and $L_3$ is a direct linkage, a substituted or unsubstituted arylene group having 6 to 18 ring carbon atoms, or a substituted or unsubstituted heteroarylene group having 5 to 15 ring carbon atoms.

The electron accepting material may have a lowest unoccupied molecular orbital (LUMO) level of about −9.0 eV to about −4.0 eV.

The anode-side hole transport layer may be adjacent to the anode.

The anode-side hole transport material may include a compound represented by the following General Formula (2)

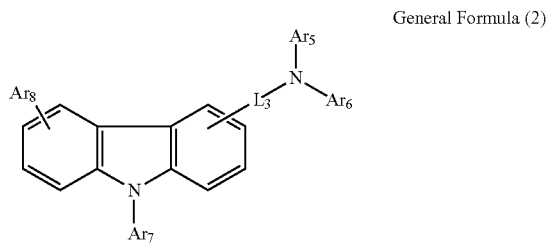

General Formula (2)

wherein, in General Formula (2), $Ar_5$ to $Ar_7$ are each independently a substituted or unsubstituted aryl group having 6 to 50 ring carbon atoms or a substituted or unsubstituted heteroaryl group having 5 to 50 ring carbon atoms, $Ar_8$ is a hydrogen atom, a deuterium atom, a halogen atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, and $L_3$ is a direct linkage, a substituted or unsubstituted arylene group having 6 to 18 ring carbon atoms, or a substituted or unsubstituted heteroarylene group having 5 to 15 ring carbon atoms.

The emission layer may include a compound represented by the following General Formula (3):

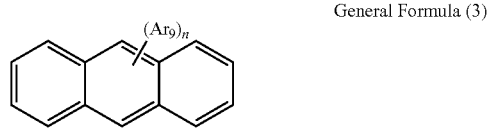

General Formula (3)

wherein, in General Formula (3), each $Ar_9$ is independently a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group or a hydroxyl group, and n is an integer of 1 to 10.

The embodiments may be realized by providing an organic electroluminescent device including an anode; an emission layer; an anode-side hole transport layer between the anode and the emission layer, the anode-side hole transport layer mainly including an electron accepting material; an intermediate hole transport material layer between the anode-side hole transport layer and the emission layer, the intermediate hole transport material layer including an intermediate hole transport material; and an emission layer-side hole transport layer between the intermediate hole transport material layer and the emission layer and adjacent to the emission layer, the emission layer-side hole transport layer including an emission layer-side hole transport material represented by the following General Formula (1):

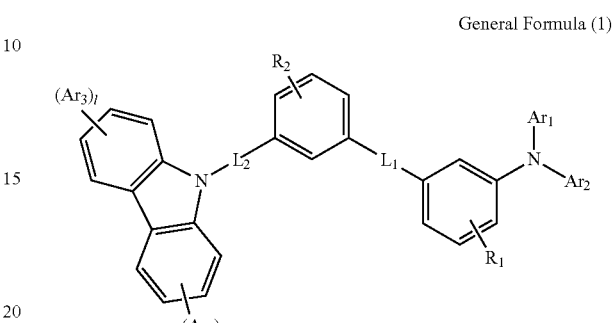

General Formula (1)

wherein, in General Formula (1), $Ar_1$ and $Ar_2$ are each independently a substituted or unsubstituted aryl group having 6 to 50 ring carbon atoms or a substituted or unsubstituted heteroaryl group having 5 to 50 ring carbon atoms, $Ar_3$ and $Ar_4$ are each independently a substituted or unsubstituted aryl group having 6 to 50 ring carbon atoms, a substituted or unsubstituted heteroaryl group having 5 to 50 ring carbon atoms, or a condensed polycyclic group formed via condensation with an adjacent ring, $R_1$ and $R_2$ are each independently a hydrogen atom, a deuterium atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, $L_1$ and $L_2$ are each independently a single bond, a substituted or unsubstituted arylene group having 6 to 18 ring carbon atoms, or a substituted or unsubstituted heteroarylene group having 5 to 15 ring carbon atoms, and l and m are each independently an integer of 0 to 4.

The intermediate hole transport material may include a compound represented by the following General Formula (2):

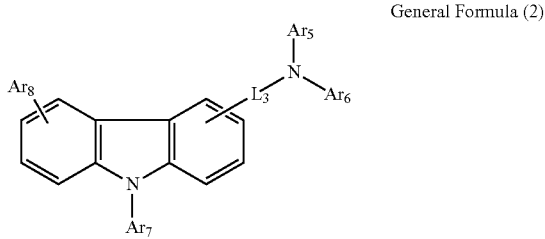

General Formula (2)

wherein, in General Formula (2), $Ar_5$ to $Ar_7$ are each independently a substituted or unsubstituted aryl group having 6 to 50 ring carbon atoms or a substituted or unsubstituted heteroaryl group having 5 to 50 ring carbon atoms, $Ar_8$ is a hydrogen atom, a deuterium atom, a halogen atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, and $L_3$ is a direct linkage, a substituted or unsubstituted arylene group having 6 to 18 ring carbon atoms, or a substituted or unsubstituted heteroarylene group having 5 to 15 ring carbon atoms.

The electron accepting material may have a lowest unoccupied molecular orbital (LUMO) level of about −9.0 eV to about −4.0 eV.

The anode-side hole transport layer may be adjacent to the anode.

The emission layer may include a compound represented by the following General Formula (3):

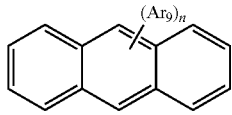

General Formula (3)

wherein, in General Formula (3), each $Ar_9$ is independently a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group or a hydroxyl group, and n is an integer of 1 to 10.

BRIEF DESCRIPTION OF THE DRAWING

Features will be apparent to those of skill in the art by describing in detail exemplary embodiments with reference to the attached drawing in which:

FIG. 1 illustrates a schematic configuration of an organic electroluminescent device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

1-1. Configuration of Organic Electroluminescent Device Including an Anode-Side Hole Transport Layer Including Anode-Side Hole Transport Material and Doped with an Electron Accepting Material (1-1-1. Whole Configuration)

First, on the basis of FIG. 1, the whole configuration of an organic electroluminescent device 100 according to an embodiment will be described.

As shown in FIG. 1, an organic electroluminescent device 100 according to an embodiment may include a substrate 110, a first electrode 120 disposed on the substrate 110, a hole transport layer 130 disposed on the first electrode 120, an emission layer 140 disposed on the hole transport layer 130, an electron transport layer 150 disposed on the emission layer 140, an electron injection layer 160 disposed on the electron transport layer 150, and a second electrode 170 disposed on the electron injection layer 160. Here, the hole transport layer 130 may be formed to have a multi-layer structure composed of a plurality of layers 131, 133 and 135.

(1-1-2. Configuration of Substrate)

The substrate 110 may be a substrate suitably used in an organic electroluminescent device. For example, the substrate 110 may be a glass substrate, a semiconductor substrate, or a transparent plastic substrate.

(1-1-3. Configuration of First Electrode)

The first electrode 120 may be, e.g. an anode, and may be formed on the substrate 110 using, e.g., an evaporation method, a sputtering method, etc. For example, the first electrode 120 may be formed as a transmission type electrode using a metal, an alloy, a conductive compound, etc. having large work function. The first electrode 120 may be formed using, e.g. indium tin oxide (ITO), indium zinc oxide (IZO), tin oxide ($SnO_2$), zinc oxide (ZnO), etc. having good transparency and conductivity. In an implementation, the first electrode 120 may be formed as a reflection type electrode using magnesium (Mg), aluminum (Al), etc.

(1-1-4. Configuration of Hole Transport Layer)

The hole transport layer 130 may include a hole transport material and may have a hole transporting function. The hole transport layer 130 may be formed, e.g., on the first electrode 120 to a layer thickness (total layer thickness of a stacked structure) of about 10 nm to about 150 nm.

In an implementation, the hole transport layer 130 of the organic electroluminescent device 100 according to an embodiment may be formed as a multi-layer by stacking, from the first electrode 120, an anode-side hole transport layer 131, an intermediate hole transport material layer 133, and an emission layer-side hole transport layer 135 one by one. In an implementation, the ratio of the thicknesses of the layers may be suitably selected.

(1-1-4-1. Configuration of Anode-Side Hole Transport Layer)

The anode-side hole transport layer 131 may be a layer that includes an anode-side hole transport material or compound and may be doped with an electron accepting material. For example, the anode-side hole transport layer 131 may be formed on the first electrode 120.

The anode-side hole transport layer 131 may be doped with the electron accepting material and may help improve a hole injection property from the first electrode 120. For example, the anode-side hole transport layer 131 may be provided around the first electrode 120. In an implementation, the anode-side hole transport layer 131 may be provided adjacent to, e.g., directly adjacent to, the first electrode 120.

The anode-side hole transport material included in the anode-side hole transport layer 131 may be a suitable hole transport material. Examples of the anode-side hole transport material included in the anode-side hole transport layer 131 may include 1,1-bis[(di-4-tolylamino)phenyl]cyclohexane (TAPC), a carbazole derivative such as N-phenyl carbazole, polyvinyl carbazole, etc., N,N'-bis(3-methylphenyl)-N,N'-diphenyl-[1,1-biphenyl]-4,4'-diamine (TPD), 4,4', 4"-tris(N-carbazolyl)triphenylamine (TCTA), N,N'-di(1-naphthyl)-N,N'-diphenylbenzidine (NPB), etc.

The electron accepting material included in the anode-side hole transport layer 131 may be a suitable electron accepting material. In an implementation, the electron accepting material included in the anode-side hole transport layer 131 may have a LUMO level of, e.g., about −9.0 eV to about −4.0 eV or about −6.0 eV to about −4.0 eV.

Examples of the electron accepting material having the LUMO level of about −9.0 eV to about −4.0 eV may include compounds represented by the following Formulae 4-1, 4-2, 4-3, 4-4, 4-5, 4-6, 4-7, 4-8, 4-9, 4-10, 4-11, 4-12, 4-13, and 4-14.

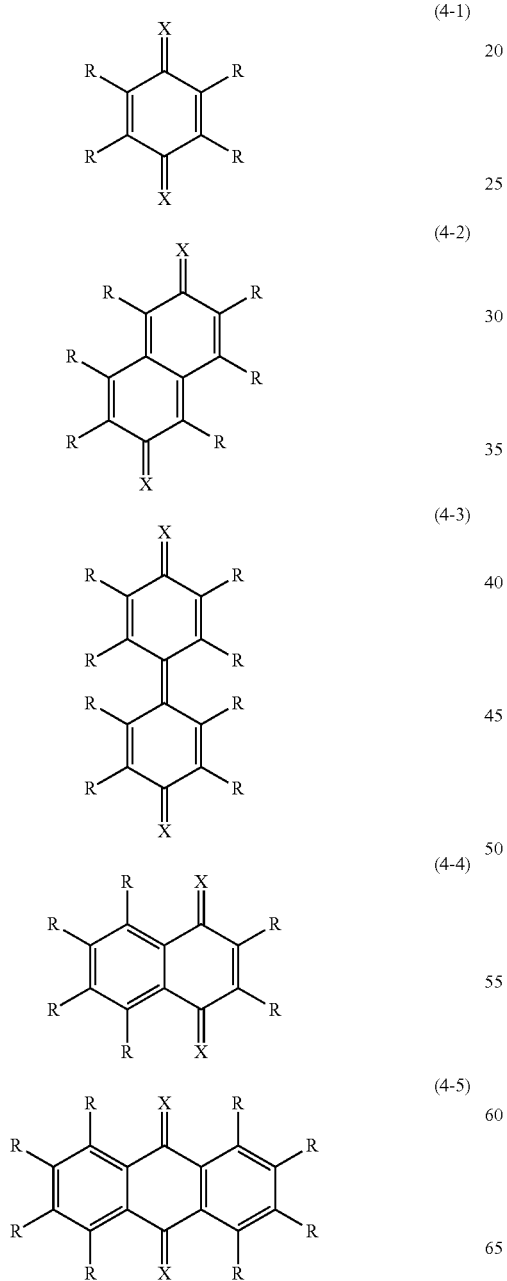

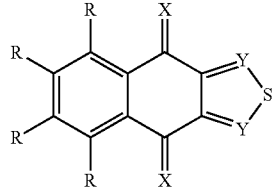

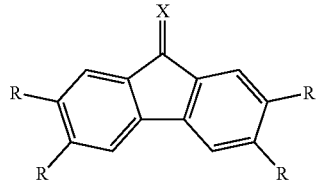

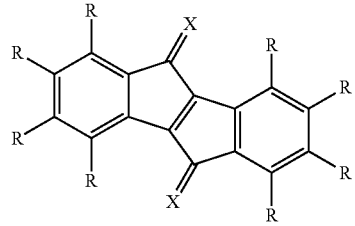

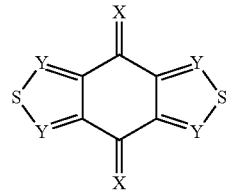

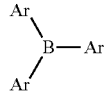

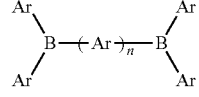

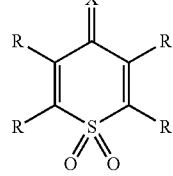

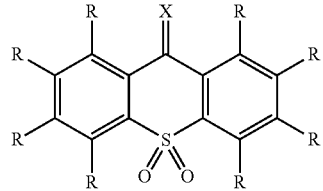

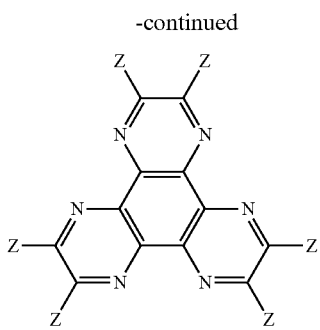

(4-14)

In the above Formulae 4-1, 4-2, 4-3, 4-4, 4-5, 4-6, 4-7, 4-8, 4-9, 4-10, 4-11, 4-12, 4-13, and 4-14, R may be or include, e.g., a hydrogen atom, a deuterium atom, a halogen atom, a fluoroalkyl group having 1 to 50 carbon atoms, a cyano group, an alkoxy group having 1 to 50 carbon atoms, an alkyl group having 1 to 50 carbon atoms, an aryl group having 6 to 50 ring carbon atoms, or a heteroaryl group having 5 to 50 ring carbon atoms.

Ar may be or include, e.g., an unsubstituted aryl group having 6 to 50 ring carbon atoms, an aryl group having 6 to 50 ring carbon atoms that is substituted with an electron withdrawing group, or a substituted or unsubstituted heteroaryl group having 5 to 50 ring carbon atoms. Y may be, e.g., a methine group (—CH═) or a nitrogen atom (—N═). Z may be, e.g., a pseudohalogen atom or a sulfur (S) atom. n may be, e.g., an integer of 10 and less. X may be a substitutent represented by one of the following formulae X1, X2, X3, X4, X5, X6, or X7.

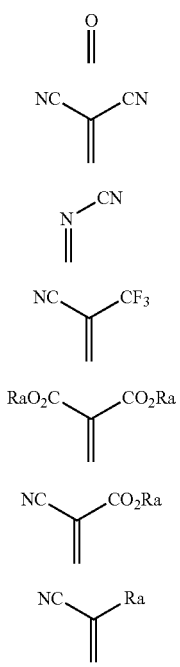

In the above Formulae X1, X2, X3, X4, X5, X6 and X7, Ra may be or include, e.g., a hydrogen atom, a deuterium atom, a halogen atom, a fluoroalkyl group having 1 to 50 carbon atoms, a cyano group, an alkoxy group having 1 to 50 carbon atoms, an alkyl group having 1 to 50 carbon atoms, a substituted or unsubstituted aryl group having 6 to 50 ring carbon atoms, or a substituted or unsubstituted heteroaryl group having 5 to 50 ring carbon atoms.

Examples of the substituted or unsubstituted aryl group having 6 to 50 ring carbon atoms (e.g., of R, Ar, and Ra) may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-tolyl group, a m-tolyl group, a p-tolyl group, a p-t-butylphenyl group, a p-(2-phenylpropyl) phenyl group, a 3-methyl-2-naphthyl group, a 4-methyl-1-naphthyl group, a 4-methyl-1-anthryl group, a 4'-methylbiphenylyl group, a 4''-t-butyl-p-terphenyl-4-yl group, a fluoranthenyl group, a fluorenyl group, and the like.

Examples of the substituted or unsubstituted heteroaryl group having 5 to 50 ring carbon atoms (e.g., of R, Ar, and Ra) may include a 1-pyrrolyl group, a 2-pyrrolyl group, a 3-pyrrolyl group, a pyridinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9- phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-fenoxaziny group, a 2-fenoxazinyl group, a 3-fenoxazinyl group, a 4-fenoxazinyl group, a 10-fenoxazinyl group, a 2-oxazolyl group, a 4-oxazolyl group, a 5-oxazolylyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl) pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, and the like.

Examples of the fluoroalkyl group in the substituted or unsubstituted fluoroalkyl group having 1 to 50 carbon atoms (of R and Ra) may include a perfluoroalkyl group such as a trifluoromethyl group, a pentafluoroethyl group, a heptafluoropropyl group and a heptadecafluorooctane group, a monofluoromethyl group, a difluoromethyl group, a trifluoroethyl group, a tetrafluoropropyl group, an octafluoropentyl group, and the like.

Examples of the substituted or unsubstituted alkyl group having 1 to 50 carbon atoms (of R and Ra) may include a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, and the like.

The substituted or unsubstituted alkoxy group having 1 to 50 carbon atoms (of R and Ra) may include, e.g., a group represented by —OY. Examples of Y may include a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 1,2-chloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, and the like.

Examples of the halogen atom (of R and Ra) may include fluorine (F), chlorine (Cl), bromine (Br), iodine (I), and the like.

In an implementation, the electron accepting material may include one of the following Compound 4-15 or Compound 4-16. For example, the LUMO level of Compound 4-15 may be about −4.40 eV, and the LUMO level of Compound 4-16 may be about −5.20 eV.

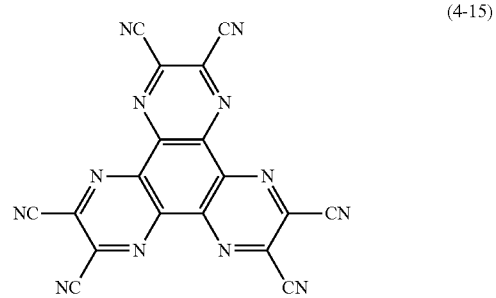

(4-15)

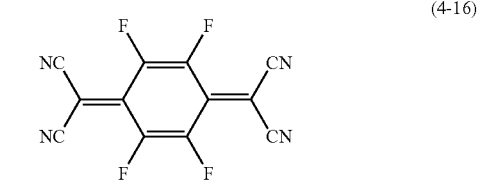

(4-16)

In an implementation, a doping amount of the electron accepting material may be an amount suitable for being doped into the anode-side hole transport layer 131. For example, the amount doped of the electron accepting material may be about 0.1 wt % to about 50 wt %, on the basis of the total amount of the anode-side hole transport material included in the anode-side hole transport layer 131. In an implementation, the doping amount may be, e.g., about 0.5 wt % to about 5 wt %.

(1-1-4-2. Configuration of Intermediate Hole Transport Material Layer)

The intermediate hole transport material layer 133 may include an intermediate hole transport material. The intermediate hole transport material layer 133 may be formed on, e.g., the anode-side hole transport layer 131.

The intermediate hole transport material included in the intermediate hole transport material layer 133 may be a suitable hole transport material. Particularly, the intermediate hole transport material may include the same hole transport materials as the anode-side hole transport materials described above.

In an implementation, the intermediate hole transport material may include a compound represented by the following General Formula (2).

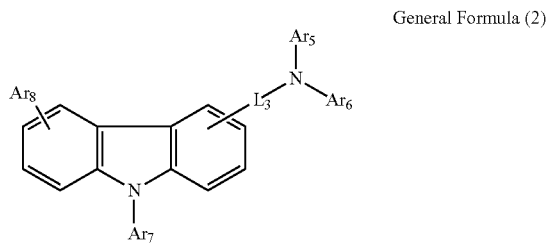

General Formula (2)

In the above General Formula (2), $Ar_5$ to $Ar_7$ may each independently be or include, e.g., a substituted or unsubstituted aryl group having 6 to 50 ring carbon atoms or a substituted or unsubstituted heteroaryl group having 5 to 50 ring carbon atoms. $Ar_8$ may be or include, e.g., a hydrogen atom, a deuterium atom, a halogen atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms. $L_3$ may be or include, e.g., a direct linkage (e.g., single bond), a substituted or unsubstituted arylene group having 6 to 18 ring carbon atoms, or a substituted or unsubstituted heteroarylene group having 5 to 15 ring carbon atoms.

Examples of $Ar_5$ to $Ar_7$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a pyrazolyl group, a dibenzofuranyl group, a dibenzothienyl group, etc. Preferably particular examples of $Ar_5$-$Ar_7$ may include the phenyl group, the biphenyl group, the terphenyl group, the fluorenyl group, the carbazolyl group, the dibenzofuranyl group, and the like.

Examples of $Ar_8$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a pyrazolyl group, a dibenzofuranyl group, a dibenzothienyl group, etc. Preferable examples of $Ar_8$ may include the phenyl group, the biphenyl group, the terphenyl group, the fluorenyl group, the carbazolyl group, the dibenzofuranyl group, a methyl group, an ethyl group, and the like.

Examples of $L_3$ (other than the direct linkage/single bond) may include a phenylene group, a biphenylene group, a terphenylene group, a naphthalene group, an anthrylene group, a phenanthrylene group, a fluorenylene group, an indenylene group, a pyrenylene group, an acetonaphthenylene group, a fluoranthenylene group, a triphenylenylene group, a pyridylene group, a furanylene group, a pyranylene group, a thienylene group, a quinolylene group, an isoquinolylene group, a benzofuranylene group, a benzothienylene group, an indolylene group, a carbazolylene group, a benzoxazolylene group, a benzothiazolylene group, a kinokisariren group, a benzoimidazolylene group, a pyrazolylene group, a dibenzofuranylene group, a dibenzothienylene group, and the like. In an implementation, $L_3$ may include, e.g., the direct linkage, the phenylene group, the biphenylene group, the terphenylene group, the fluorenylene group, the carbazolylene group, or the dibenzofuranylene group.

Examples of the compound represented by General Formula (2) may include the following Compounds 2-1 to 2-16.

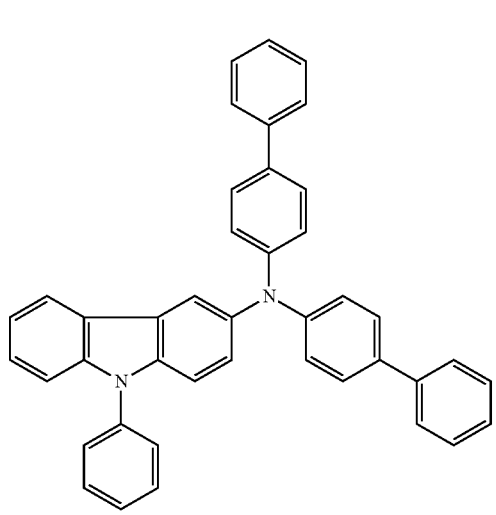

(2-1)

(2-2)
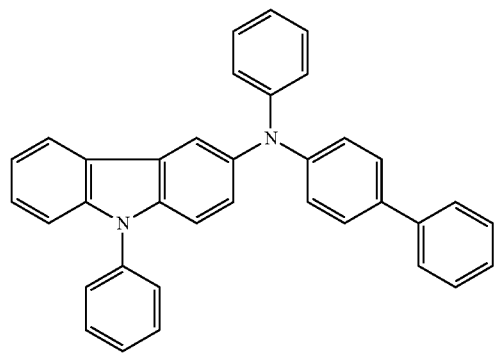
(2-3)
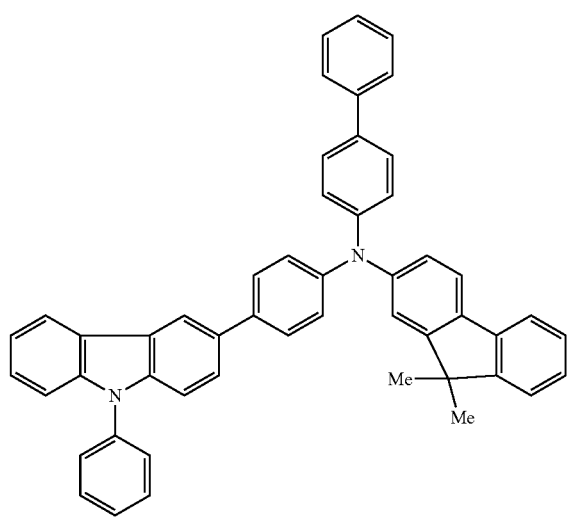
(2-4)
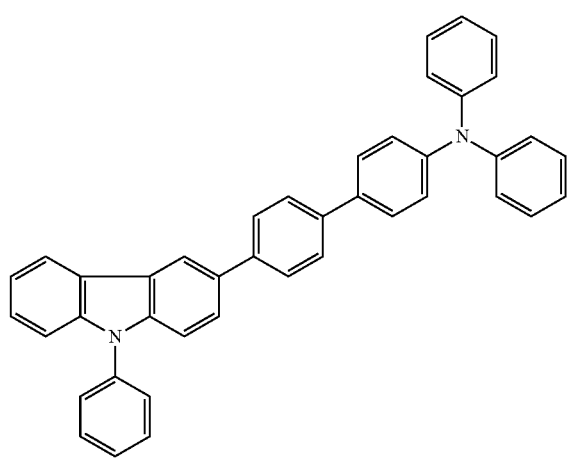
(2-5)
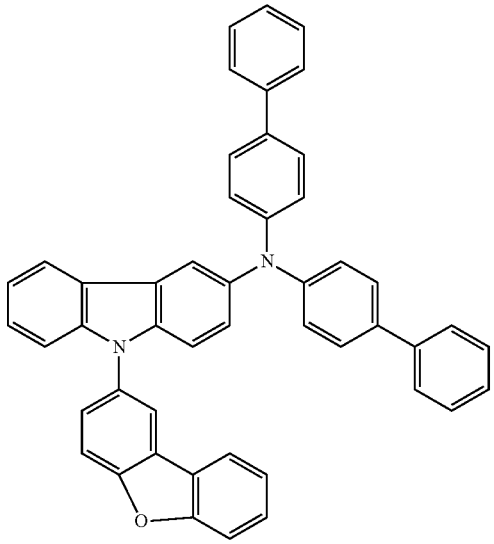
(2-6)
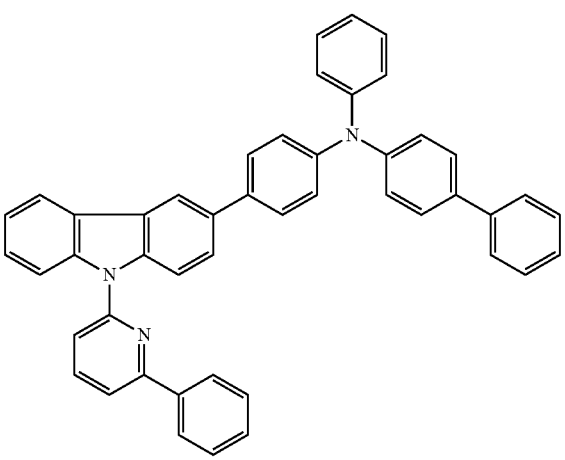
(2-7)
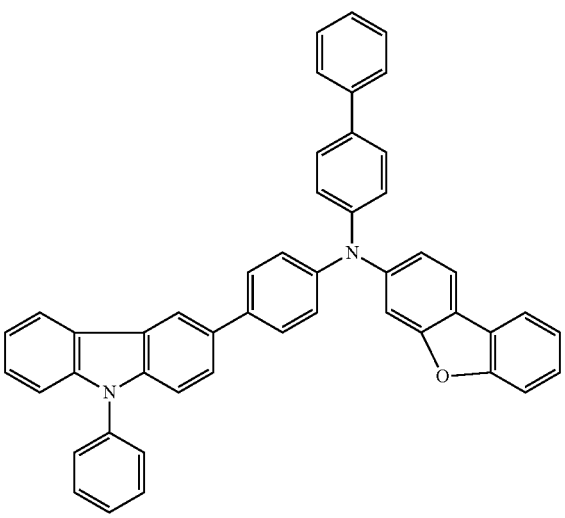

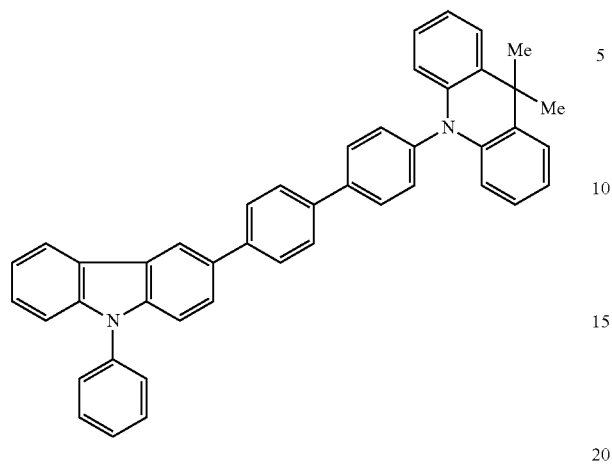
(2-8)
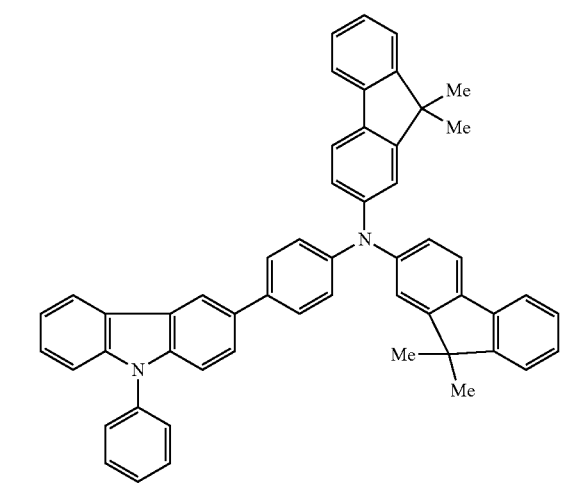
(2-11)
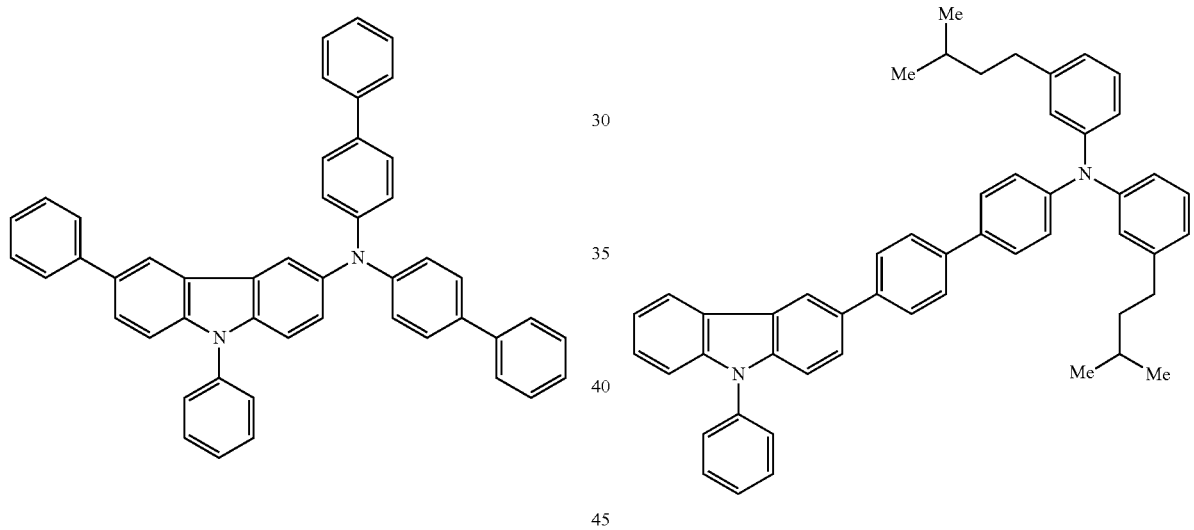
(2-9)
(2-12)
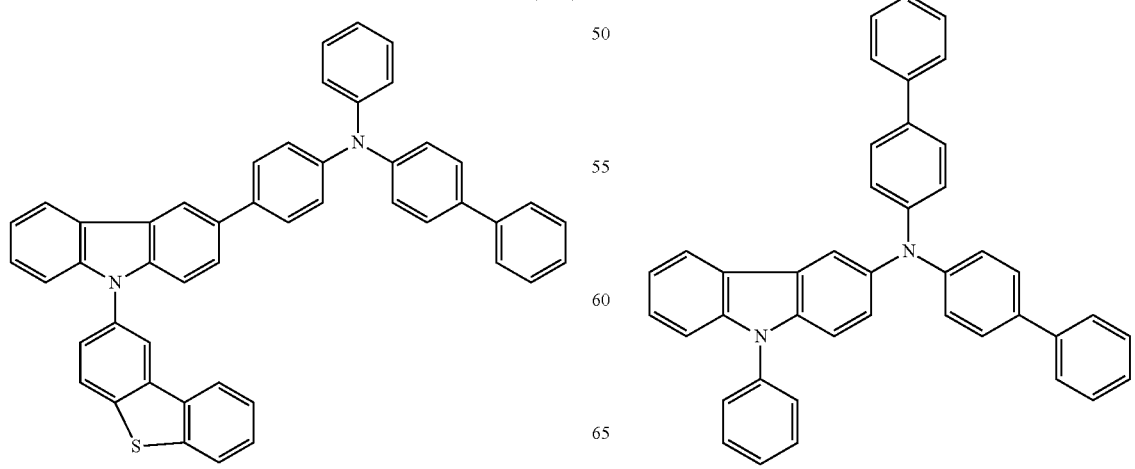
(2-10)
(2-13)

-continued (2-14)

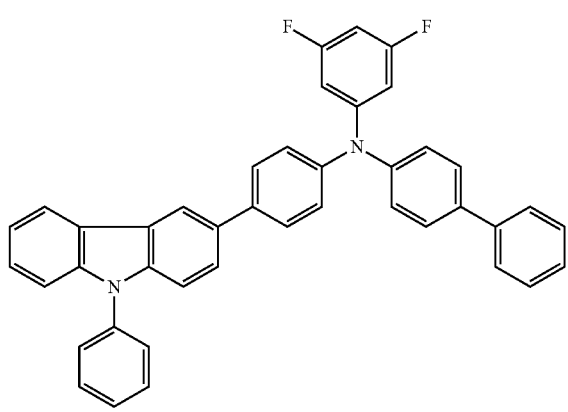

(2-15)

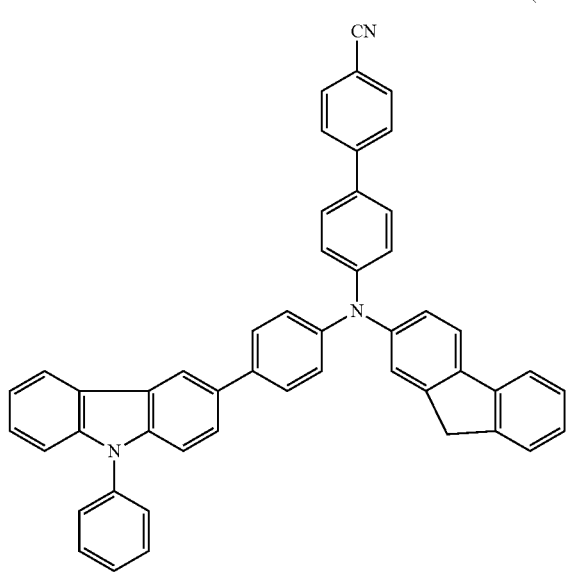

(2-16)

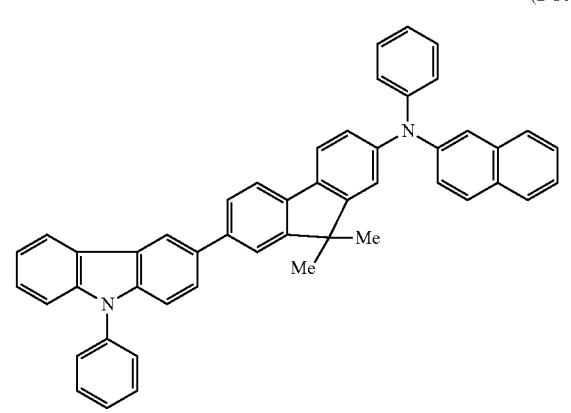

The intermediate hole transport material layer 133 may include the compound represented by the above General Formula (2) as the intermediate hole transport material, may help improve the hole transporting property of the hole transport layer 130, and may help improve the emission efficiency of the organic electroluminescent device 100.

In an implementation, the compound represented by General Formula (2) may be included in the anode-side hole transport layer 131 as the anode-side hole transport material. In the case that the anode-side hole transport layer 131 includes the compound represented by General Formula (2) as the anode-side hole transport material, the hole transporting property of the hole transport layer 130 may be improved, and the emission efficiency of the organic electroluminescent device 100 may be improved.

For example, in the case that a concentration of a carbazole derivative (such as the compound represented by General Formula (1) or (2)) in the hole transport layer 130 is high, the emission life of the organic electroluminescent device 100 may increase further.

In an implementation, the anode-side hole transport layer 131 may further include other hole transport materials as the anode-side hole transport material, in addition to the compound represented by General Formula (2).

(1-1-4-3. Configuration of Emission Layer-Side Hole Transport Layer)

The emission layer-side hole transport layer 135 may include a compound represented by the following General Formula (1). The emission layer-side hole transport layer 135 may be formed on the intermediate hole transport material layer 133, adjacent to, e.g., directly adjacent to, the emission layer 140.

General Formula (1)

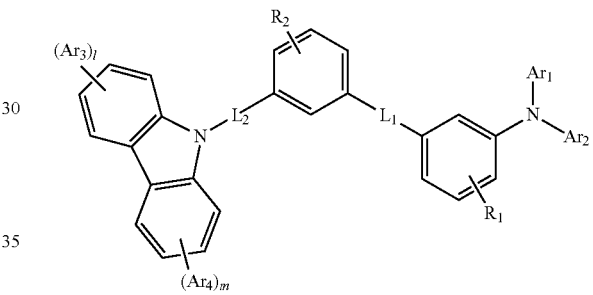

In the above General Formula (1), $Ar_1$ and $Ar_2$ may each independently be or include, e.g., a substituted or unsubstituted aryl group having 6 to 50 ring carbon atoms or a substituted or unsubstituted heteroaryl group having 5 to 50 ring carbon atoms. $Ar_3$ and $Ar_4$ may each independently be or include, e.g., a substituted or unsubstituted aryl group having 6 to 50 ring carbon atoms, a substituted or unsubstituted heteroaryl group having 5 to 50 ring carbon atoms, or a condensed polycyclic group formed via condensation with an adjacent aromatic ring.

$R_1$ and $R_2$ may each independently be or include, e.g., a hydrogen atom, a deuterium atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms. $L_1$ and $L_2$ may each independently be or include, e.g., a direct linkage (e.g., single bond), a substituted or unsubstituted arylene group having 6 to 18 ring carbon atoms, or a substituted or unsubstituted heteroarylene group having 5 to 15 ring carbon atoms. 1 and m may each independently be, e.g., an integer of 0 to 4.

Examples of $Ar_1$ to $Ar_4$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a pyrazolyl group, a dibenzofuranyl group, a dibenzothienyl group, etc. In an implementation, examples of $Ar_1$-$Ar_4$ may include the phenyl group, the biphenyl group, the terphenyl group, the fluorenyl group, the carbazolyl group, the dibenzofuranyl group, and the like.

In an implementation, $Ar_3$ and $Ar_4$ may form a condensed ring with an adjacent aromatic ring. For example, $Ar_3$ and $Ar_4$ may each independently form a condensed ring via combination with the aromatic ring of an adjacent carbazolyl group. In an implementation, $Ar_3$ and $Ar_4$ may form a condensed ring via bonding together.

Examples of $R_1$ and $R_2$ (other than the hydrogen atom and the deuterium atom) may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a pyrazolyl group, a dibenzofuranyl group, a dibenzothienyl group, a methyl group, an ethyl group, a propyl group, an isopropyl group, a n-butyl group, etc. In an implementation, examples of $R_1$ and $R_2$ may include the hydrogen atom, the deuterium atom, the phenyl group, the biphenyl group, the terphenyl group, the fluorenyl group, the carbazolyl group, the dibenzofuranyl group, the methyl group, the ethyl group, etc.

Examples of $L_1$ and $L_2$ (other than the direct linkage) may include a substituent obtained by substituting the substituent illustrated in the above $Ar_1$ to $Ar_4$ with a divalent substituent. Examples of $L_1$ and $L_2$ (other than the direct linkage) may include the phenylene group, the naphthalene group, the biphenylylene group, the thienothiophenylene group, and the pyridylene group. In an implementation, $L_1$ and $L_2$ may each independently include, e.g., the direct linkage, the phenylene group, or the biphenylylene group.

Examples of the compound represented by General Formula (1) may include the following Compounds 1-1 to 1-22.

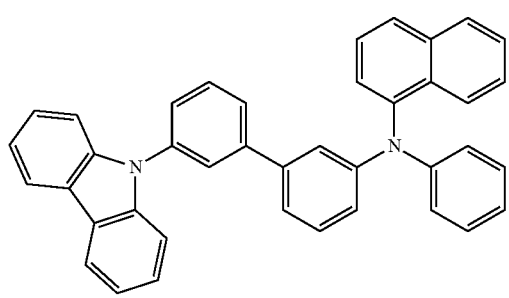

(1-1)

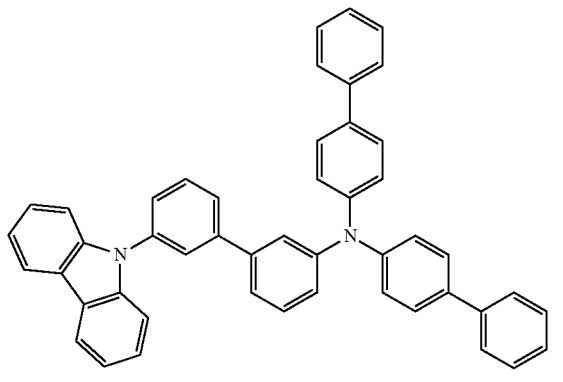

(1-2)

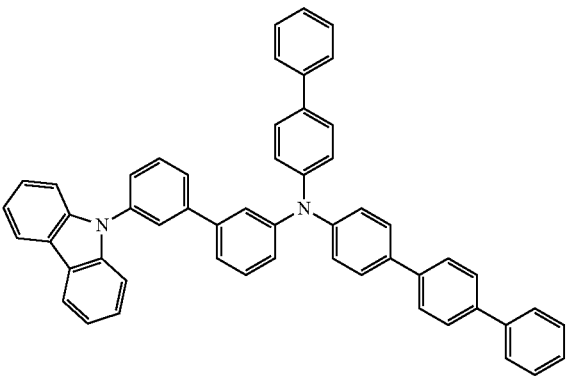

(1-3)

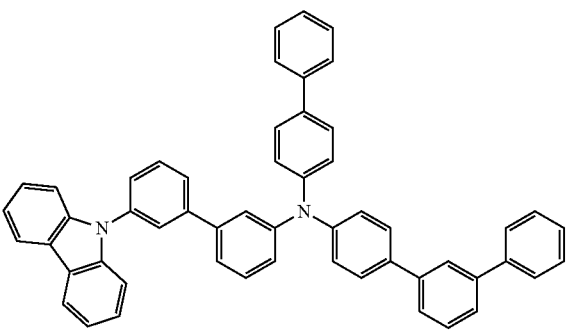

(1-4)

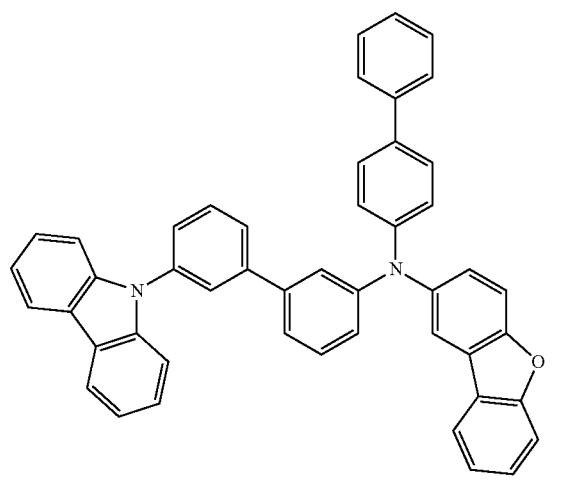

(1-5)

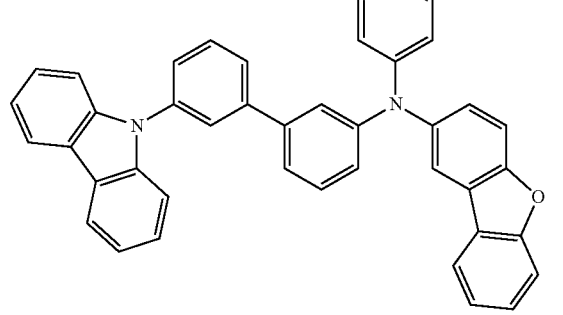

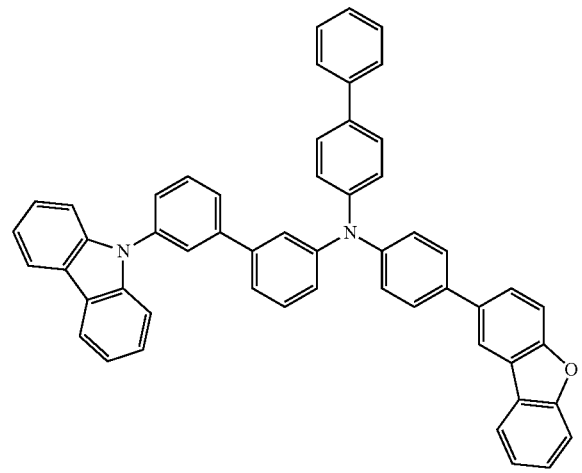
(1-6)
(1-7)
(1-8)
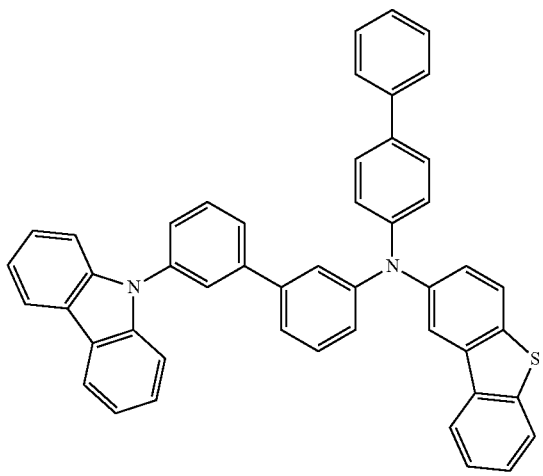
(1-9)
(1-10)
(1-11)

(1-12)
(1-13)
(1-14)
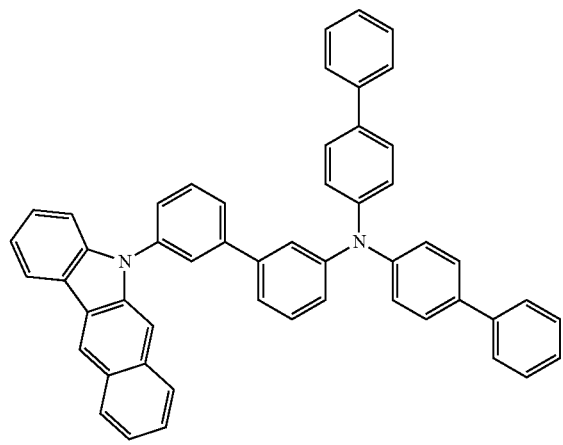
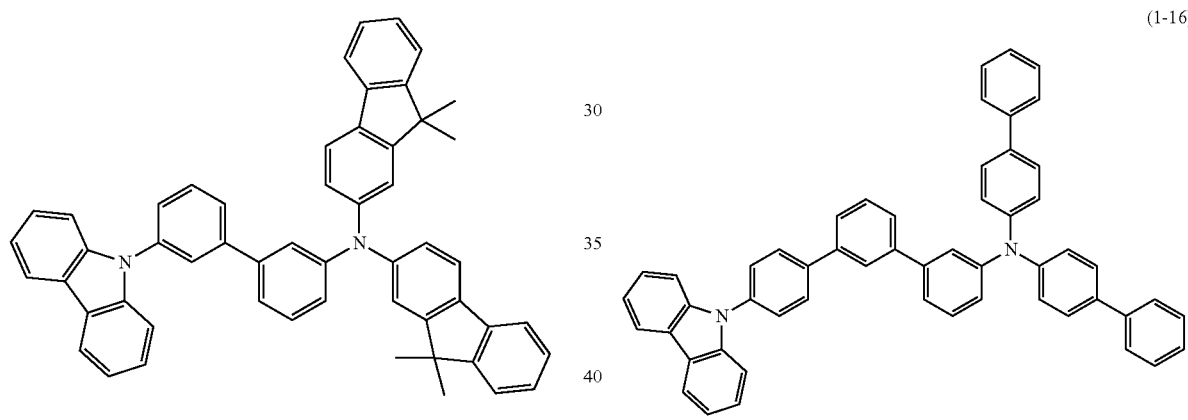
(1-15)
(1-16)
(1-17)
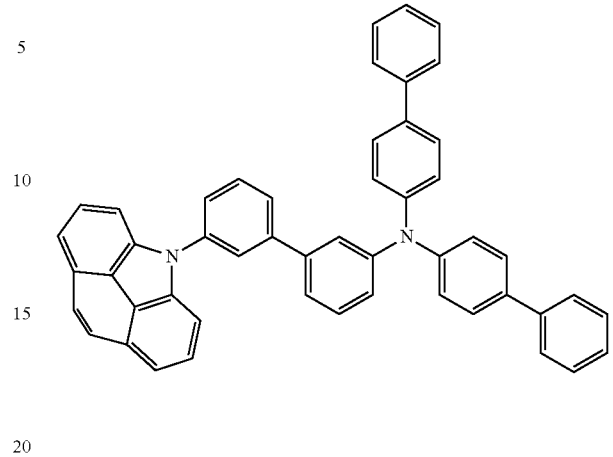
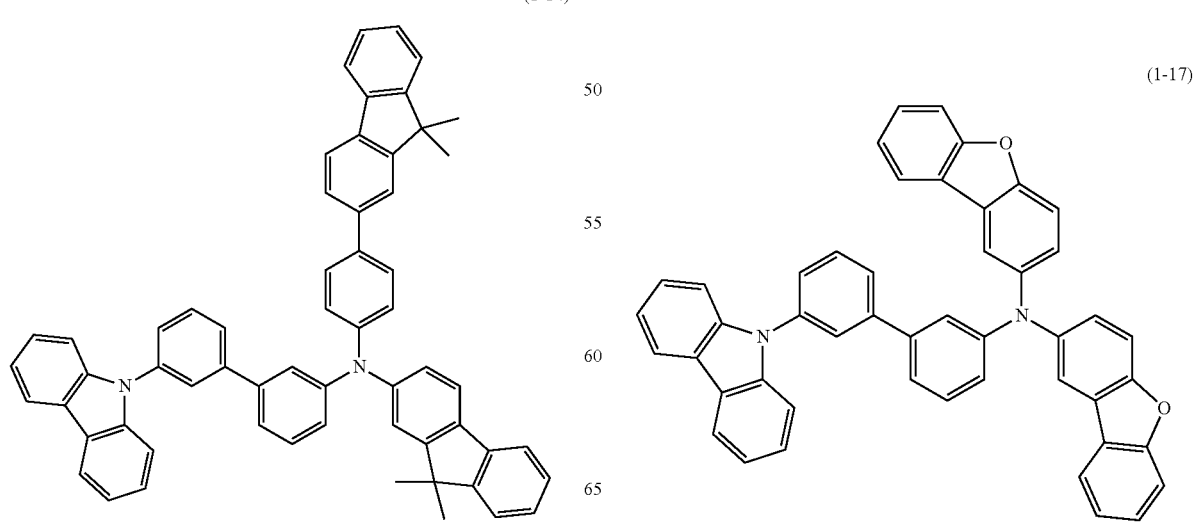

(1-18)
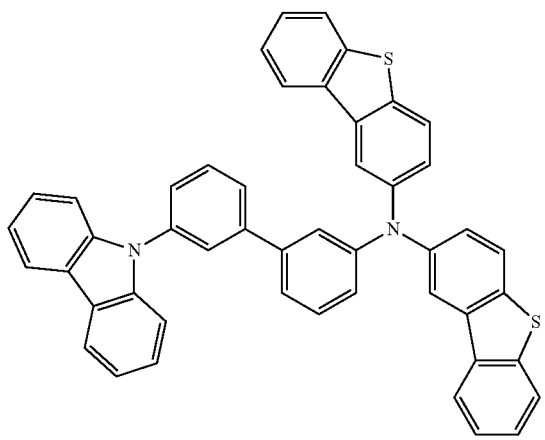

(1-19)
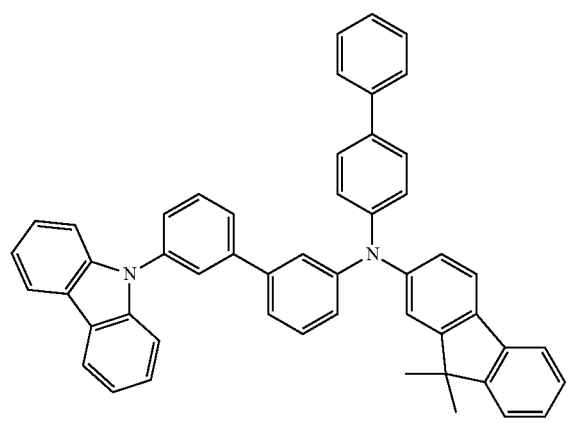

(1-20)
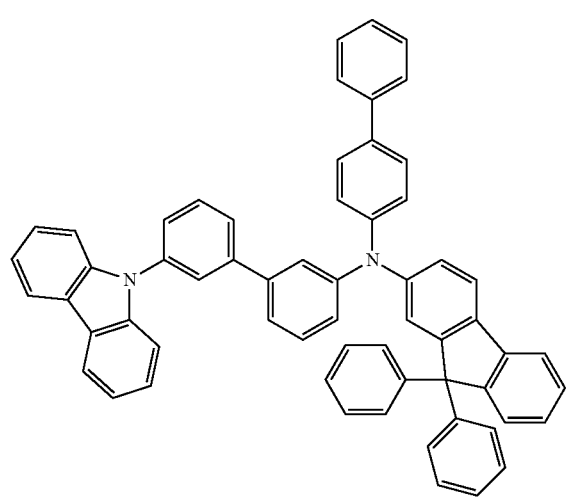

(1-21)
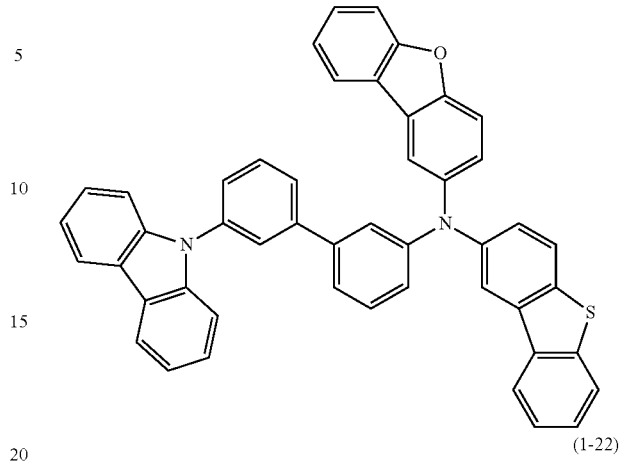

(1-22)
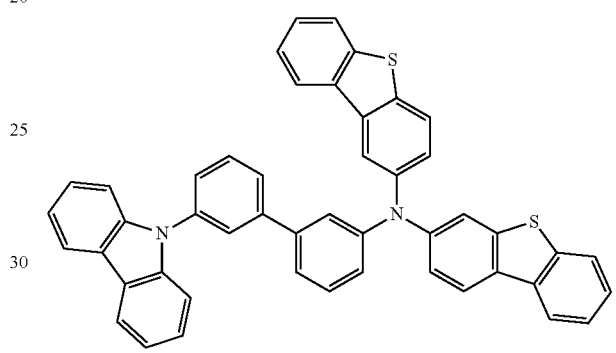

The emission layer-side hole transport layer 135 may include the compound represented by the above General Formula (1) as the emission layer-side hole transport material, and may help protect the hole transport layer 130 from electrons that are not consumed in the emission layer 140. In an implementation, the emission layer-side hole transport layer 135 may include the compound represented by the above General Formula (1), and diffusion of energy of an excited state generated in the emission layer 140 to the hole transport layer 130 may be prevented. Thus, according to this configuration, the emission layer-side hole transport layer 135 may help improve the current flow durability of the hole transport layer 130.

In an implementation, the emission layer-side hole transport layer 135 may be formed around the emission layer 140. In an implementation, the emission layer-side hole transport layer 135 may be formed adjacent to, e.g., directly adjacent to, the emission layer 140, to effectively help prevent the diffusion of electrons or energy from the emission layer 140.

In an implementation, the emission layer-side hole transport layer 135 may include the compound represented by the above General Formula (1), the charge balance of the whole organic electroluminescent device 100 may be controlled, and the diffusion of the electron accepting material doped into the anode-side hole transport layer 131 into the emission layer 140 may be restrained. Accordingly, the emission layer-side hole transport layer 135 may help improve the hole transport property of the hole transport layer 130.

The emission layer-side hole transport layer 135 may include the compound represented by the above General Formula (1), and the charge transport property and current flow durability of the hole transport layer 130 may be improved, thereby improving the emission efficiency and emission life of the organic electroluminescent device 100.

As described above, the hole transport layer 130 including the anode-side hole transport layer 131, the intermediate hole transport material layer 133, and the emission layer-side hole transport layer 135 may help improve the current flow durability and hole transport property of the organic electroluminescent device 100. Thus, the organic electroluminescent device 100 according to an embodiment may have improved emission efficiency and emission life.

(1-1-5. Configuration of Emission Layer)

The emission layer 140 may include a host material, a dopant material as a luminescent material, etc. and may emit light via fluorescence or phosphorescence. The emission layer 140 may be formed, e.g., on the hole transport layer 130 to a layer thickness from about 10 nm to about 60 nm.

The host material and the dopant material included in the emission layer 140 may include suitable host materials and dopant materials. For example, the emission layer 140 may include a fluoranthene derivative, a pyrene derivative, an arylacetylene derivative, a fluorene derivative, a perylene derivative, a chrysene derivative, etc. as the host material or the dopant material. For example, the emission layer 140 may include tris(8-quinolinolato)aluminum (Alq3), 4,4'-N, N'-dicarbazole-biphenyl (CBP), poly(n-vinylcarbazole) (PVK), TCTA, 1,3,5-tris(N-phenylbenzimidazole-2-yl)benzene (TPBI), 3-tert-butyl-9,10-di(naphtho-2-yl)anthracene (TBADN), distyrylarylene (DSA), 4,4'-bis(9-carbazole)-2,2'-dimethyl-biphenyl (dmCBP), bis(2,2-diphenyl vinyl)-1,1'-biphenyl (DPVBi), 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-(E)-2-(6-((E)-4-(diphenylamino)styryl)naphthalen-2-yl)vinyl)phenyl)-N-phenylbenzenamine (N-BDAVBi), 2,5,8,11-tetra-t-butylperylene (TBPe), 1,1-dipyrene, 1,4-dipyrenylbenzene, 1,4-bis(N,N-diphenylamino)pyrene, etc. as the host material or the dopant material.

In an implementation, the emission layer 140 may include a compound represented by the following General Formula (3).

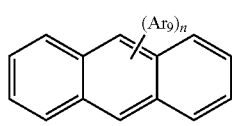

General Formula (3)

In the above General Formula (3), each $Ar_9$ may independently be or include, e.g., a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group, or a hydroxyl group. n may be, e.g., an integer of 1 to 10.

Examples of the compound represented by General Formula (3) may include the following Compounds 3-1, 3-2, 3-3, 3-4, 3-5, 3-6, 3-7, 3-8, 3-9, 3-10, 3-11, and 3-12.

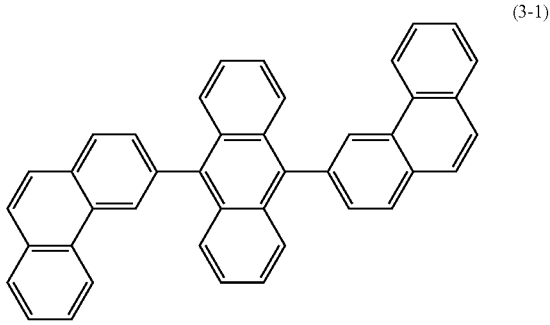

(3-1)

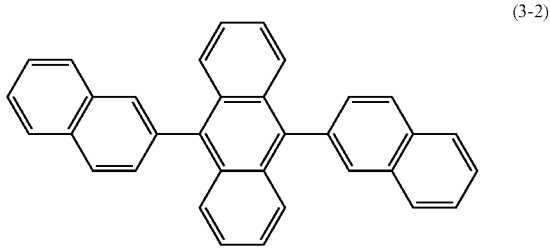

(3-2)

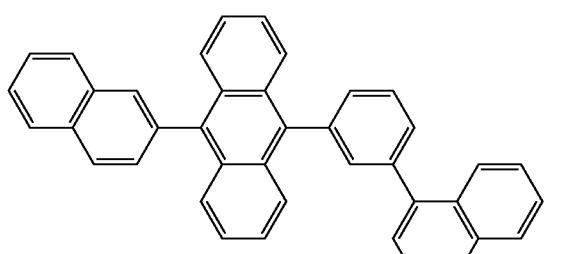

(3-3)

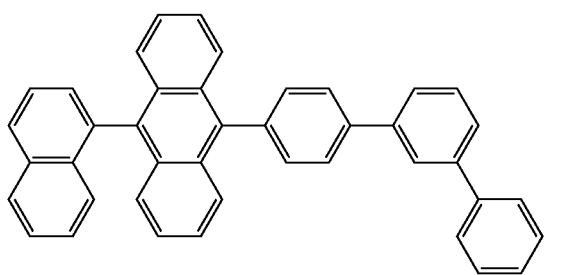

(3-4)

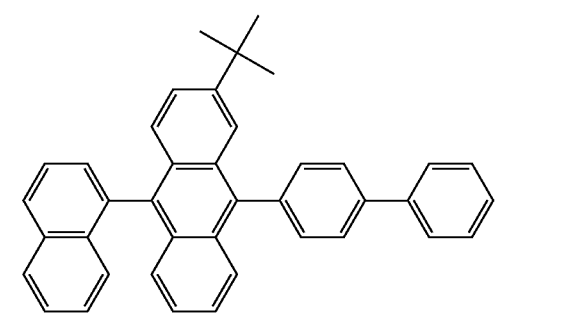

(3-5)

-continued (3-6)
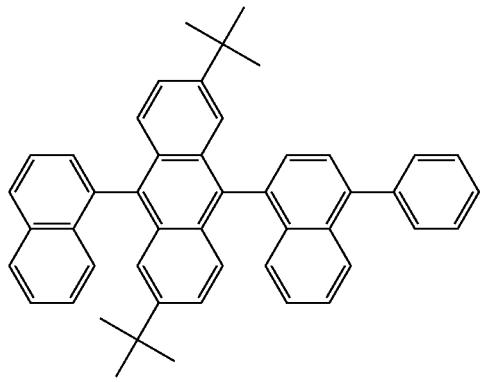

(3-7)
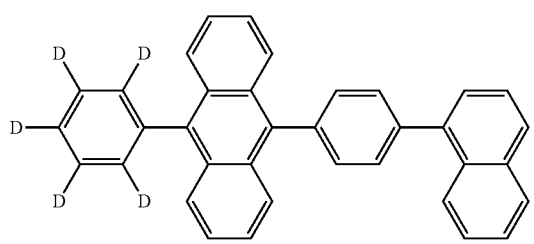

(3-8)
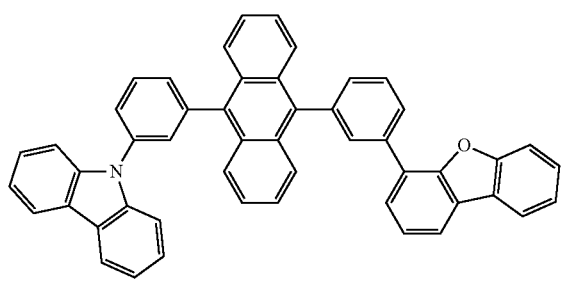

(3-9)
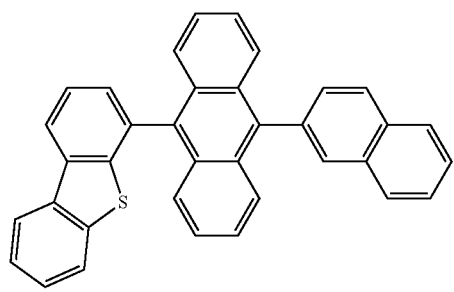

(3-10)
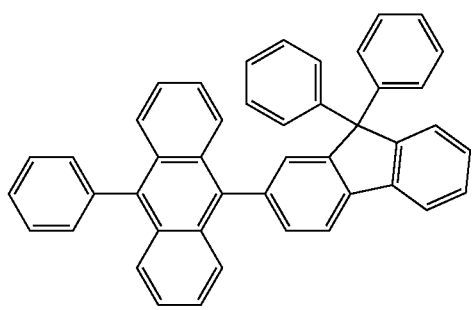

-continued (3-11)
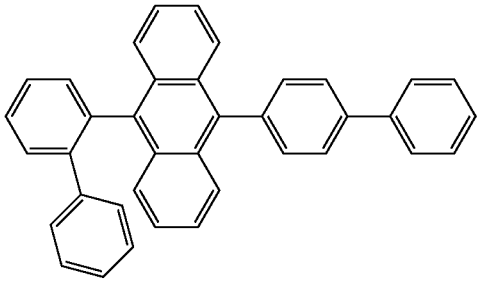

(3-12)

In the case that the emission layer 140 includes the compound represented by General Formula (3), the anode-side hole transport layer 131 may help improve the hole injection property from the first electrode 120 even further markedly. Thus, the emission layer 140 may further improve the emission property of the organic electroluminescent device 100 by including the compound represented by General Formula (3).

In an implementation, the emission layer 140 may include the compound represented by General Formula (3) as the host material or as the dopant material.

In an implementation, the emission layer 140 may be formed as an emission layer emitting light with a specific color. For example, the emission layer 140 may be formed as a red emitting layer, a green emitting layer, or a blue emitting layer.

In the case that the emission layer 140 is the blue emitting layer, a suitable blue dopant may be used. For example, perylene or derivative thereof, an iridium (Ir) complex such as bis[2-(4,6-difluorophenyl)pyridinate]picolinate iridium (III) (FIrpic), etc. may be used as a blue dopant.

In addition, in the case that the emission layer 140 is the red emitting layer, a suitable red dopant may be used. For example, rubrene or derivative thereof, 4-dicyanomethylene-2-(p-dimethylaminostyryl)-6-methyl-4H-pyrane (DCM) and the derivative thereof, an iridium complex such as bis(1-phenylisoquinoline)(acetylacetonate)iridium(III) (Ir(piq)$_2$(acac), an osmium (Os) complex, a platinum complex, etc. may be used as the red dopant.

In addition, in the case that the emission layer 140 is the green emitting layer, a suitable green dopant may be used. For example, coumarin or derivative thereof, an iridium complex such as tris(2-phenylpyridine)iridium(III) (Ir(ppy)$_3$), etc. may be used.

(1-1-6. Configuration of Electron Transport Layer)

The electron transport layer 150 may be a layer including an electron transport material and having an electron transporting function. The electron transport layer 150 may be formed, e.g., on the emission layer 150 to a layer thickness from about 15 nm to about 50 nm. The electron transport material included in the electron transport layer 150 may include a suitable electron transport material. Examples of the electron transport material may include a quinoline derivative such as tris(8-quinolinolato)aluminum (Alq3), 1,2,4-triazole derivative (TAZ), bis(2-methyl-8-quinolinolato)-(p-phenylphenolate)-aluminum (BAlq), berylliumbis (benzoquinoline-10-olate) (BeBq2), a Li complex such as lithium quinolate (LiQ), etc. In an implementation, a compound having a nitrogen-containing aromatic ring may be used as the electron transport material. Examples of the nitrogen-containing aromatic ring may include a compound including a pyridine ring such as 1,3,5-tri[(3-pyridyl)-phen-3-yl]benzene, a compound including a triazine ring such as 2,4,6-tris(3'-(pyridine-3-yl)biphenyl-2-yl)-1,3,5-triazine, a compound including an imidazole derivative such as 2-(4-(N-phenylbenzoimidazolyl-1-ylphenyl)-9,10-dinaphthylanthracene), etc.

(1-1-7. Configuration of Electron Injection Layer)

The electron injection layer 160 may be a layer having function of facilitating injection of electrons from the second electrode 170. The electron injection layer 160 may be formed, e.g., on the electron transport layer 150 to a layer thickness from about 0.3 nm to about 9 nm. The electron injection layer 160 may be formed using a suitable material that may be used as a material for forming the electron injection layer 160. Examples of a material for forming the electron injection layer 160 may include a Li complex such as lithium 8-quinolinato (Liq), lithium fluoride (LiF), etc., sodium chloride (NaCl), cesium fluoride (CsF), lithium oxide ($Li_2O$), barium oxide (BaO), etc.

(1-1-8. Configuration of Second Electrode)

The second electrode 170 may be, e.g., a cathode, and may be formed on the electron injection layer 160 using, e.g., an evaporation method or a sputtering method. For example, the second electrode 170 may be formed as a reflection type electrode using a metal, an alloy, a conductive compound, etc. having a small work function. The second electrode 170 may be formed using, e.g. lithium (Li), magnesium (Mg), aluminum (Al), aluminum-lithium (Al—Li), calcium (Ca), magnesium-indium (Mg—In), magnesium-silver (Mg—Ag), etc. In addition, the second electrode 170 may be formed as a transmission type electrode using ITO, IZO, etc.

(1-1-9. Modification Example of Organic Electroluminescent Device)

In an implementation, the organic electroluminescent device 100 may have the structure shown in FIG. 1. In the organic electroluminescent device 100 according to an embodiment, some layers may be formed as a multi-layer, or another layer may be additionally formed. In an implementation, in the organic electroluminescent device 100 according to an embodiment, at least one of the electron transport layer 150 and the electron injection layer 160 may be omitted.

In an implementation, in the organic electroluminescent device 100 according to an embodiment, a hole injection layer may be provided between the first electrode 120 and the hole transport layer 130.

The hole injection layer may be a layer having function of facilitating injection of holes from the first electrode 120. The hole injection layer may be formed, e.g., on the first electrode 120 to a layer thickness from about 10 nm to about 150 nm. The hole injection layer may be formed using a suitable material for forming the hole injection layer. Examples of the material for forming the hole injection layer may include a triphenylamine-containing polyether ketone (TPAPEK), 4-isopropyl-4'-methyldiphenyliodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), a phthalocyanine compound such as copper phthalocyanine, etc., 4,4',4"-tris(3-methylphenylphenylamino)triphenylamine (m-MTDATA), N,N'-di(1-naphthyl)-N,N'-diphenylbenzidine (NPB), 4,4',4"-tris{N,N-diphenylamino}triphenylamine (TDATA), 4,4',4"-tris(N,N-2-naphthylphenylamino)triphenylamine (2-TNATA), polyaniline/dodecylbenzenesulfonic acid (Pani/DBSA), poly(3,4-ethylenedioxythiophene)/poly(4-styrenesulfonate) (PEDOT/PSS), polyaniline/camphorsulfonic acid (Pani/CSA) or polyaniline/poly(4-styrenesulfonate) (PANI/PSS), etc.

(1-1-9. Method of Manufacturing Organic Electroluminescent Device)

Each layer of the organic electroluminescent device 100 according to an embodiment as described above may be formed by selecting an appropriate layer forming method according to materials such as vacuum evaporation, sputtering, various coating methods, etc.

For example, a metal layer such as the first electrode 120, the second electrode 170, the electron injection layer 160, etc. may be formed using an evaporation method including an electron beam evaporation method, a hot filament evaporation method and a vacuum evaporation method, a sputtering method, and a plating method such as an electroplating method and an electroless plating method.

In addition, an organic layer such as the hole transport layer 130, the emission layer 140 and the electron transport layer 150 may be formed using a physical vapor deposition (PVD) method such as a vacuum deposition method, a printing method such as a screen printing method and an ink jet printing method, a laser transcription method, or a coat method such as a spin coat method.

Hereinabove, an embodiment of the organic electroluminescent device 100 according to an embodiment has been explained in detail.

1-2. Examples

Hereinafter, the organic electroluminescent devices according to exemplary embodiments will be explained in particular referring to examples and comparative examples. In addition, the following embodiments are only for illustration, and the organic electroluminescent devices according to exemplary embodiments are not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

(1-2-1. Manufacture of Organic Electroluminescent Device)

An organic electroluminescent device was manufactured by the following manufacturing method.

First, with respect to an ITO-glass substrate patterned and washed in advance, surface treatment using UV-Ozone ($O_3$) was conducted. In addition, the layer thickness of an ITO layer (first electrode) on a glass substrate was about 150 nm.

After ozone treatment, the substrate was washed and inserted in a glass bell jar type evaporator for forming an organic layer, and an anode-side hole transport layer, an intermediate hole transport material layer, an emission layer-side hole transport layer, an emission layer and an electron transport layer were evaporated one by one with a vacuum degree of about $10^{-4}$ to about $10^{-5}$ Pa. The layer thickness of each of the anode-side hole transport layer, the intermediate hole transport material layer, and the emission layer-side hole transport layer was about 10 nm. The layer thickness of the emission layer was about 25 nm, and the layer thickness of the electron transport layer was about 25 nm. Then, the substrate was moved into a glass bell jar type evaporator for forming a metal layer, and the electron injection layer and the second electrode were evaporated with a vacuum degree of about $10^{-4}$ to about $10^{-5}$ Pa. The layer thickness of the electron injection layer was about 1 nm and the layer thickness of the second electrode was about 100 nm.

Here, the anode-side hole transport layer, the intermediate hole transport material layer, and the emission layer-side hole transport layer correspond to the hole transport layer with a stacked structure. The anode-side hole transport layer, the intermediate hole transport material layer, and the emission layer-side hole transport layer were manufactured in the Examples and Comparative Examples using the materials shown in the following Table 1.

In addition, e.g. the expression of "Compound 1-3, 4-15" in Table 1 means that Compound 1-3 was the anode-side hole transport material, and Compound 4-15 was the doped electron accepting material. In addition, the amount doped of the electron accepting material was about 3 wt %, on the basis of the amount or weight of the anode-side hole transport material.

In addition, Compounds 6-1, 6-2, and 6-3 are common hole transport materials represented by the following formulae, and "-" means that a corresponding layer was not formed.

(6-1)

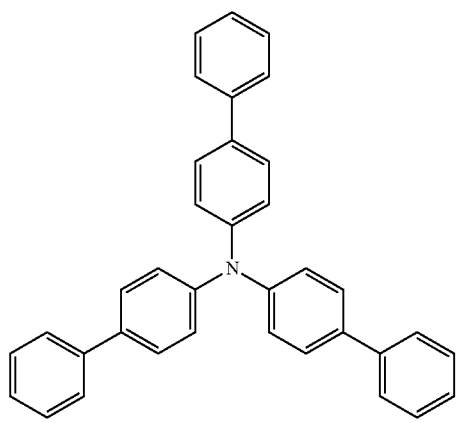

(6-2)

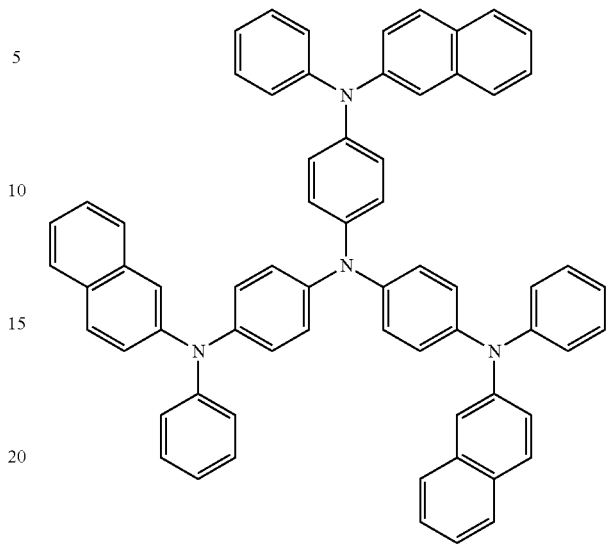

(6-3)

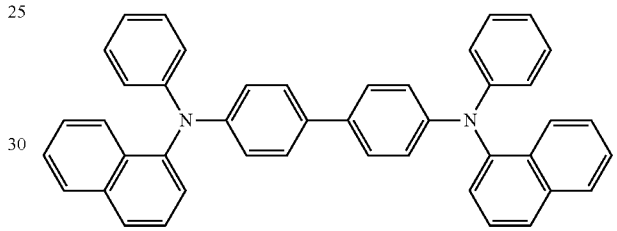

In addition, in Examples 1-1 to 1-3 and Comparative Examples 1-1 to 1-5, 9,10-di(2-naphthyl)anthracene (ADN, Compound 3-2) was used as the host material of the emission layer, and 2,5,8,11-tetra-t-butylperylene (TBP) was used as a dopant material. In Example 4, 2-(9,9-spirobifluorene-2-yl)-9,9-spirobifluorene (Compound 7-1) was used as the host material of the emission layer, and TBP was used as the dopant material. In addition, the dopant material was added in an amount ratio of about 3 wt % on the basis of the amount of the host material.

Here, Compound 7-1 is a compound represented by the following formula and is a suitable host material in an emission layer.

(7-1)

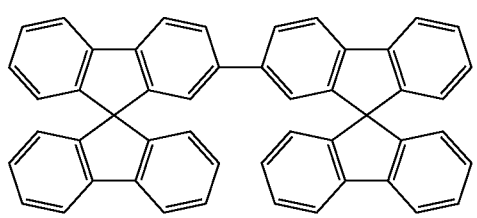

In addition, the electron transport layer was formed using Alq3, the electron injection layer was formed using LiF, and the second electrode was formed using aluminum (Al).

(1-2-2. Evaluation Results)

Then, the driving voltage, the emission efficiency, and the half life of the organic electroluminescent device thus manufactured were evaluated. Evaluation results are shown together in the following Table 1. In addition, the driving voltage and the emission efficiency in each Example and Comparative Example were obtained by measuring with current density of about 10 mA/cm². In addition, the half life was obtained by measuring luminance with the initial luminance of about 1,000 cd/m².

In addition, the measurement was conducted using a source meter of 2400 series of Keithley Instruments Co., Color brightness photometer CS-200 (Konica Minolta holdings, measurement angle of 1°), and a PC program LabVIEW8.2 (National instruments in Japan) for measurement in a dark room.

anode-side hole transport layer doped with the electron accepting material was desirable.

In addition, when comparing Example 1-1 with Comparative Example 1-1, the properties of Example 1-1 were good. In Comparative Example 1-1, the compounds included in the intermediate hole transport material layer and the emission layer-side hole transport layer were changed when compared to those in Example 1-1. Thus, it may be seen that the provision of the emission layer-side hole transport layer including the compound represented by General Formula (1) adjacent to the emission layer would be desirable.

TABLE 1

| | Anode-side hole transport layer | Intermediate hole transport material layer | Emission layer-side hole transport layer | Host material | Driving voltage [V] | Emission efficiency [cd/A] | Half life [hr] |
|---|---|---|---|---|---|---|---|
| Example 1-1 | Compound 2-3, Compound 4-15 | Compound 2-3 | Compound 1-2 | Compound 3-2 | 6.2 | 7.6 | 3,900 |
| Example 1-2 | Compound 6-2, Compound 4-15 | Compound 2-3 | Compound 1-2 | Compound 3-2 | 6.5 | 7.5 | 3,200 |
| Example 1-3 | Compound 2-3, Compound 4-15 | Compound 6-3 | Compound 1-2 | Compound 3-2 | 6.4 | 7.6 | 3,000 |
| Example 1-4 | Compound 2-3, Compound 4-15 | Compound 6-3 | Compound 1-2 | Compound 7-1 | 6.5 | 7.4 | 2,800 |
| Comparative Example 1-1 | Compound 2-3 Compound 4-15 | Compound 1-2 | Compound 2-3 | Compound 3-2 | 6.4 | 7.2 | 2,100 |
| Comparative Example 1-2 | Compound 2-3 | Compound 2-3 | Compound 1-2 | Compound 3-2 | 7.5 | 7.2 | 2,200 |
| Comparative Example 1-3 | Compound 2-3, Compound 4-15 | Compound 2-3 | Compound 6-1 | Compound 3-2 | 6.4 | 6.8 | 2,300 |
| Comparative Example 1-4 | Compound 2-3 | Compound 2-3, Compound 4-5 | Compound 1-2 | Compound 3-2 | 11.2 | 2.3 | 120 |
| Comparative Example 1-5 | — | Compound 2-3 | Compound 1-2 | Compound 3-2 | 11.0 | 2.8 | 150 |

Referring to the results in Table 1, the emission efficiency was improved, and the emission life was increased for the organic electroluminescent devices of Examples 1-1 to 1-4 when compared to those of Comparative Examples 1-1 to 1-5. For example, when comparing Examples 1-1 to 1-4 with Comparative Example 1-5 (not including an anode-side hole transport layer doped with an electron accepting material), the properties of Examples 1-1 to 1-4 were good. Thus, it may be seen that the emission efficiency and emission life were increased for the organic electroluminescent device by providing three layers of the anode-side hole transport layer, the intermediate hole transport material layer, and the emission layer-side hole transport layer between the first electrode and the emission layer.

For example, when comparing Example 1-1 with Comparative Example 1-2, the properties of Example 1-1 were good. In Comparative Example 1-2, the electron accepting material (e.g. Compound 4-15) was not doped into the anode-side hole transport layer. Thus, it may be seen that the In addition, when comparing Examples 1-1 and 1-2 with Comparative Example 1-3, the properties of Examples 1-1 and 1-2 were good. In Comparative Example 1-3, another hole transport material, Compound 6-1 was used in the emission layer-side hole transport material included in the emission layer-side hole transport layer, instead of the compound represented by General Formula (1). Thus, it may be seen that the inclusion of the compound represented by General Formula (1) in the emission layer-side hole transport layer would be desirable.

In addition, when comparing Example 1-1 with Comparative Example 1-4, the properties of Example 1-1 were good. In Comparative Example 1-4, compounds included in the anode-side hole transport layer and the intermediate hole transport material layer were changed when compared to Example 1-1. Thus, it may be seen that the anode-side hole transport layer doped with the electron accepting material would desirably be provided around the first electrode (anode).

In addition, when comparing Example 1-1 with Example 1-2, the properties of Examples 1-1 and 1-2 were good. In Example 1-2, a hole transport material, Compound 6-2 (not including a carbazolyl group) was used in the anode-side hole transport material included in the anode-side hole transport layer instead of the compound represented by General Formula (2). Thus, it may be seen that the anode-side hole transport material included in the anode-side hole transport layer may be the compound represented by General Formula (2).

In addition, when comparing Example 1-1 with Example 1-3, the properties of Examples 1-1 and 1-3 were good. In Example 1-3, a hole transport material, Compound 6-3 (not including a carbazolyl group) was used in the intermediate hole transport material included in the intermediate hole transport material layer, instead of the compound represented by General Formula (2). Thus, it may be seen that the intermediate hole transport material included in the intermediate hole transport material layer may be the compound represented by General Formula (2).

In addition, when comparing Examples 1-1 to 1-3 with Example 1-4, the properties of Examples 1-1 to 1-4 were good. In Example 1-4, a host material of an emission layer 7-1 was used as the host material of the emission layer, instead of Compound 3-2 represented by General Formula (3). Thus, it may be seen that the emission layer may include the compound represented by General Formula (3) as the host material or the dopant material.

As described above, according to exemplary embodiments, the anode-side hole transport layer may be doped with the electron accepting material, the intermediate hole transport material layer and the emission layer-side hole transport layer including the compound represented by General Formula (1) may be stacked between the first electrode (anode) and the emission layer, and the emission efficiency and emission life of the organic electroluminescent device may be increased.

It may be seen that by disposing the emission layer-side hole transport layer including the compound represented by General Formula (1), the emission layer-side hole transport layer may protect the hole transport layer from electrons not consumed in the emission layer and may help prevent the diffusion of excited state energy generated in the emission layer into the hole transport layer, thereby controlling the charge balance of the whole device. In addition, it may be seen that by disposing the emission layer-side hole transport layer including the compound represented by General Formula (1), the emission layer-side hole transport layer may help restrain the diffusion of the electron accepting material included in the anode-side hole transport layer provided near the first electrode (anode) into the emission layer.

2-1. Configuration of Organic Electroluminescent Device Including Anode-Side Hole Transport Layer Mainly Including Electron Accepting Material Hereinafter, an organic electroluminescent device including an anode-side hole transport layer mainly including an electron accepting material will be explained referring to FIG. 1.

The organic electroluminescent device may include the anode-side hole transport layer mainly including the electron accepting material may include the above-mentioned anode-side hole transport material and may have the same whole configuration as the organic electroluminescent device including the anode-side hole transport layer doped with the electron accepting material, including the configuration of the substrate, the configuration of the first electrode, the configuration of the emission layer, the configuration of the electron transport layer, the configuration of the electron injection layer, the configuration of the second electrode, the method of manufacturing the organic electroluminescent device and the modification example of the organic electroluminescent device, and has the different configuration of the hole transport layer. Thus, the configuration of the hole transport layer will be explained particularly, hereinafter.

(2-1-1. Configuration of Hole Transport Layer)

The hole transport layer 130 may include a hole transport material and may have hole transporting function. The hole transport layer 130 may be formed, e.g., on the first electrode 120 to a layer thickness (total layer thickness of a stacked structure) of about 10 nm to about 150 nm.

In an implementation, the hole transport layer 130 of the organic electroluminescent device 100 according to an embodiment may be formed as a multi-layer by stacking, from the first electrode 120, an anode-side hole transport layer 131, an intermediate hole transport material layer 133, and an emission layer-side hole transport layer 135 one by one. In an implementation, the thicknesses of the layers may have a suitable ratio.

(2-1-1-1. Configuration of Anode-Side Hole Transport Layer)

The anode-side hole transport layer 131 may be a layer mainly including an electron accepting material. For example, the anode-side hole transport layer 131 may be formed on the first electrode 120.

In an implementation, the anode-side hole transport layer 131 may be a layer formed using mainly the electron accepting material. In an implementation, the anode-side hole transport layer 131 may further include a material other than the electron accepting material. The expression of "the anode-side hole transport layer 131 may be formed using mainly the electron accepting material" or the layer mainly including an electron accepting material means that the anode-side hole transport layer 131 includes about 50 wt % or more of the electron accepting material, on the basis of the total amount or weight of the anode-side hole transport layer 131.

The anode-side hole transport layer 131 may be formed using mainly the electron accepting material and may help improve a hole injection property from the first electrode 120. For example, the anode-side hole transport layer 131 may be provided around the first electrode 120. In an implementation, the anode-side hole transport layer 131 may be adjacent to, e.g., directly adjacent to, the first electrode 120.

The electron accepting material included in the anode-side hole transport layer 131 may include a suitable electron accepting material. In an implementation, the electron accepting material included in the anode-side hole transport layer 131 may have a LUMO level of about −9.0 eV to about −4.0 eV, e.g., about −6.0 eV to about −4.0 eV.

Examples of the electron accepting material having the LUMO level of about −9.0 eV to about −4.0 eV may include compounds represented by the following Formulae 4-1, 4-2, 4-3, 4-4, 4-5, 4-6, 4-7, 4-8, 4-9, 4-10, 4-11, 4-12, 4-13, and 4-14.

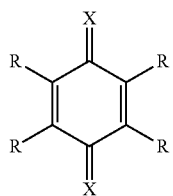 (4-1)

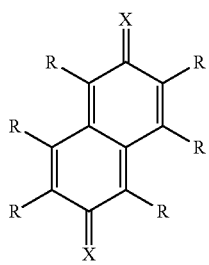 (4-2)

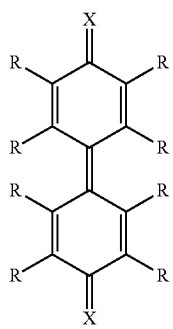 (4-3)

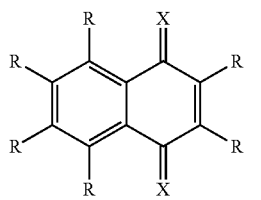 (4-4)

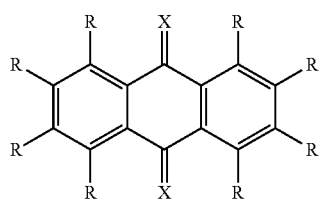 (4-5)

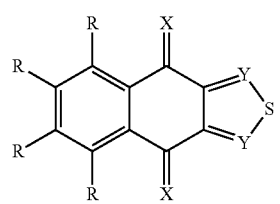 (4-6)

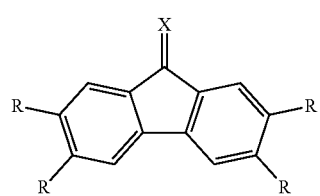 (4-7)

-continued

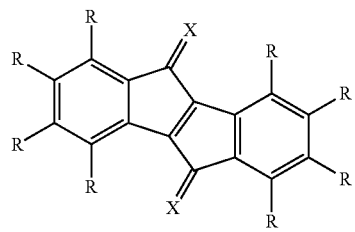 (4-8)

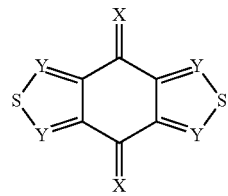 (4-9)

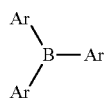 (4-10)

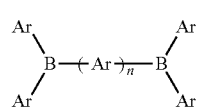 (4-11)

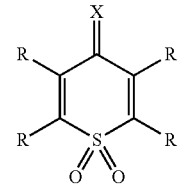 (4-12)

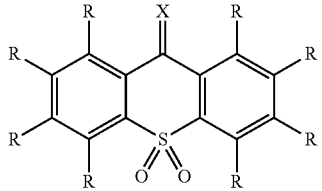 (4-13)

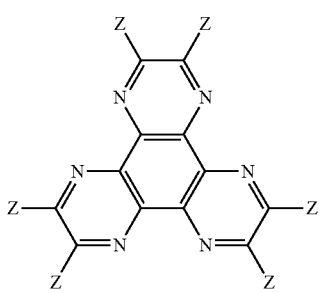 (4-14)

In the above Formulae 4-1, 4-2, 4-3, 4-4, 4-5, 4-6, 4-7, 4-8, 4-9, 4-10, 4-11, 4-12, 4-13 and 4-14, R may be, e.g., a hydrogen atom, a deuterium atom, a halogen atom, a fluoroalkyl group having 1 to 50 carbon atoms, a cyano group, an alkoxy group having 1 to 50 carbon atoms, an alkyl group having 1 to 50 carbon atoms, an aryl group having 6 to 50 ring carbon atoms, or a heteroaryl group having 5 to 50 ring carbon atoms. Ar may be or include, e.g., an unsubstituted aryl group having 6 to 50 carbon atoms, an aryl group having 6 to 50 carbon atoms that is substituted with an electron withdrawing group, or a substituted or unsubstituted heteroaryl group having 5 to 50 ring carbon atoms. Y may be, e.g., a methine group (—CH═) or a nitrogen atom (–N═). Z may be, e.g., a pseudohalogen atom or a sulfur (S) atom. n may be, e.g., an integer of 10 and less. X may be, e.g., a substituent represented by one of the following formulae X1, X2, X3, X4, X5, X6, and X7.

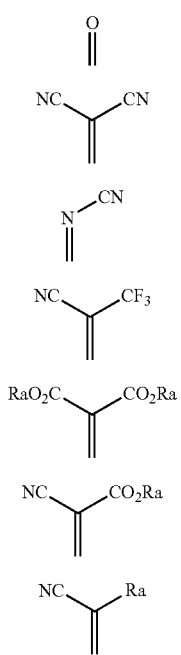

In the above Formulae X1, X2, X3, X4, X5, X6 and X7, Ra may be a hydrogen atom, a deuterium atom, a halogen atom, a fluoroalkyl group having 1 to 50 carbon atoms, a cyano group, an alkoxy group having 1 to 50 carbon atoms, an alkyl group having 1 to 50 carbon atoms, a substituted or unsubstituted aryl group having 6 to 50 ring carbon atoms, or a substituted or unsubstituted heteroaryl group having 5 to 50 ring carbon atoms.

Examples of the substituted or unsubstituted aryl group having 6 to 50 ring carbon atoms (e.g., of R, Ar and Ra) may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-tolyl group, a m-tolyl group, a p-tolyl group, a p-t-butylphenyl group, a p-(2-phenylpropyl) phenyl group, a 3-methyl-2-naphthyl group, a 4-methyl-1-naphthyl group, a 4-methyl-1-anthryl group, a 4'-methylbiphenylyl group, a 4''-t-butyl-p-terphenyl-4-yl group, a fluoranthenyl group, a fluorenyl group, etc.

Examples of the substituted or unsubstituted heteroaryl group having 5 to 50 ring carbon atoms (of R, Ar and Ra) may include a 1-pyrrolyl group, a 2-pyrrolyl group, a 3-pyrrolyl group, a pyridinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-fenoxaziny group, a 2-fenoxazinyl group, a 3-fenoxazinyl group, a 4-fenoxazinyl group, a 10-fenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1- yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, etc.

Examples of the fluoroalkyl group in the substituted or unsubstituted fluoroalkyl group having 1 to 50 carbon atoms (of R and Ra) may include a perfluoroalkyl group such as a trifluoromethyl group, a pentafluoroethyl group, a heptafluoropropyl group and a heptadecafluorooctane group, a monofluoromethyl group, a difluoromethyl group, a trifluoroethyl group, a tetrafluoropropyl group, an octafluoropentyl group, etc.

Examples of the substituted or unsubstituted alkyl group having 1 to 50 carbon atoms (of R and Ra) may include a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, etc.

The substituted or unsubstituted alkoxy group having 1 to 50 carbon atoms (of R and Ra) may be, e.g., a group represented by —OY. Examples of Y may include a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, etc.

Examples of the halogen atom (of R and Ra) may include fluorine (F), chlorine (Cl), bromine (Br), iodine (I), etc.

In an implementation, the electron accepting material may include one of the following Compounds 4-15 and 4-16. For example, the LUMO level of Compound 4-15 may be about −4.40 eV, and the LUMO level of Compound 4-16 may be about −5.20 eV.

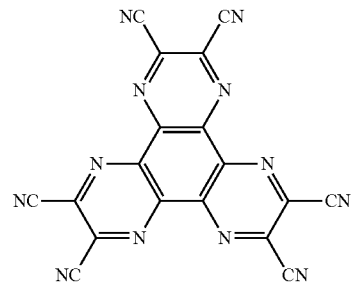

(4-15)

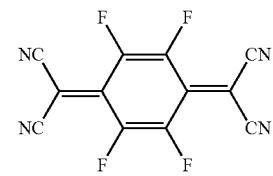

(4-16)

(2-1-1-2. Configuration of Intermediate Hole Transport Material Layer)

The intermediate hole transport material layer 133 may include an intermediate hole transport material. The intermediate hole transport material layer 133 may be formed on, e.g., the anode-side hole transport layer 131.

The intermediate hole transport material included in the intermediate hole transport material layer 133 may include a suitable hole transport material. Examples of the intermediate hole transport material included in the intermediate hole transport material layer 133 may include TAPC, a carbazole derivative such as N-phenyl carbazole, polyvinyl carbazole, etc., TPD, TCTA, NPB, etc.

In an implementation, the intermediate hole transport material may include a compound represented by the following General Formula (2).

General Formula (2)

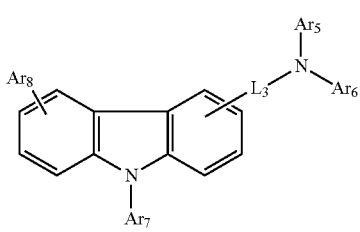

In the above General Formula (2), $Ar_5$ to $Ar_7$ may each independently be or include, e.g., a substituted or unsubstituted aryl group having 6 to 50 ring carbon atoms or a substituted or unsubstituted heteroaryl group having 5 to 50 ring carbon atoms. $Ar_8$ may be or include, e.g., a hydrogen atom, a deuterium atom, a halogen atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms. $L_3$ may be or may include, e.g., a direct linkage (e.g., a single bond), a substituted or unsubstituted arylene group having 6 to 18 ring carbon atoms, or a substituted or unsubstituted heteroarylene group having 5 to 15 ring carbon atoms.

Examples of $Ar_5$ to $Ar_7$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a pyrazolyl group, a dibenzofuranyl group, a dibenzothienyl group, etc. In an implementation, $Ar_5$ to $Ar_7$ may include, e.g., the phenyl group, the biphenyl group, the terphenyl group, the fluorenyl group, the carbazolyl group, the dibenzofuranyl group, etc.

Examples of $Ar_8$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a pyrazolyl group, a dibenzofuranyl group, a dibenzothienyl group, a methyl group, an ethyl group, a propyl group, an isopropyl group, a n-butyl group, etc. In an implementation, $Ar_8$ may include, e.g., the phenyl group, the biphenyl group, the terphenyl group, the fluorenyl group, the carbazolyl group, the dibenzofuranyl group, the methyl group, the ethyl group, etc.

Examples of $L_3$ (other than the direct linkage) may include a phenylene group, a biphenylene group, a terphenylene group, a naphthalene group, an anthrylene group, a phenanthrylene group, a fluorenylene group, an indenylene group, a pyrenylene group, an acetonaphthenylene group, a fluoranthenylene group, a triphenylenylene group, a pyridylene group, a furanylene group, a pyranylene group, a thienylene group, a quinolylene group, an isoquinolylene group, a benzofuranylene group, a benzothienylene group, an indolylene group, a carbazolylene group, a benzox- azolylene group, a benzothiazolylene group, a kinokisariren group, a benzoimidazolylene group, a pyrazolylene group, a dibenzofuranylene group, a dibenzothienylene group, etc. In an implementation, $L_3$ may include, e.g., a direct linkage, the phenylene group, the biphenylene group, the terphenylene group, the fluorenylene group, the carbazolylene group or the dibenzofuranylene group.

Examples of the compound represented by General Formula (2) may include the following Compounds 2-1 to 2-16.

(2-1)

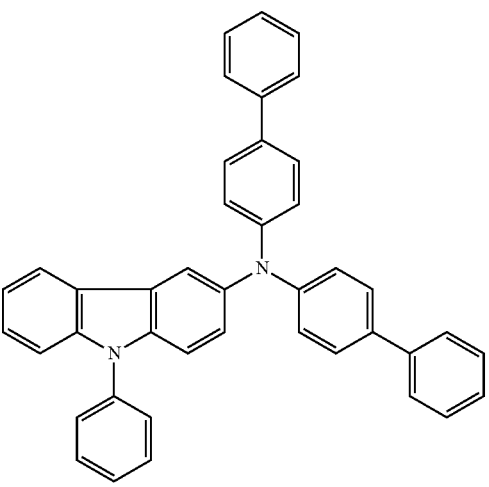

(2-2)

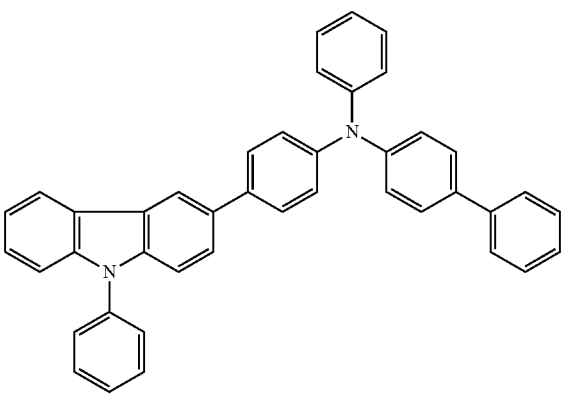

(2-3)

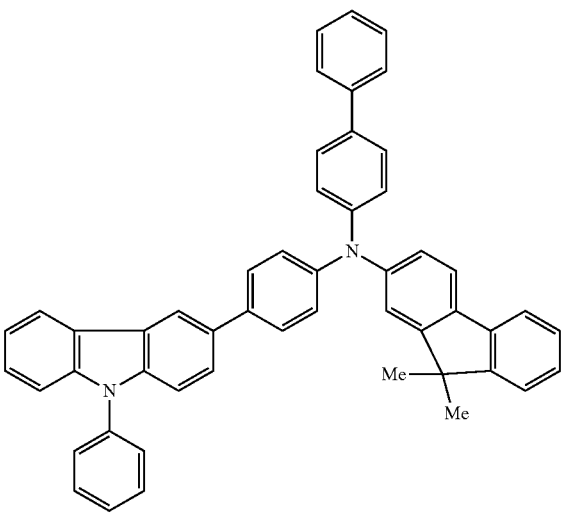

(2-4)
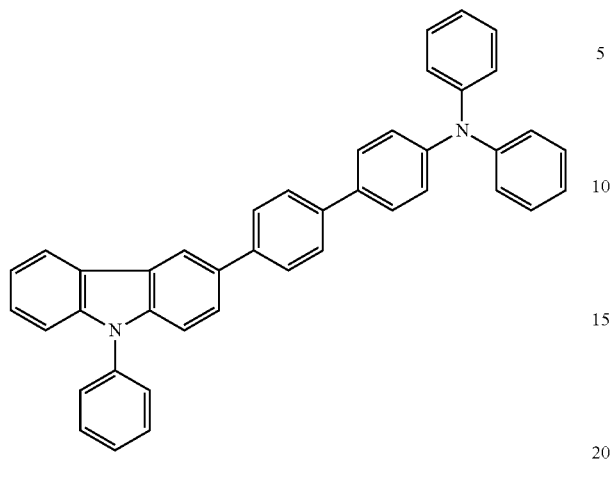
(2-5)
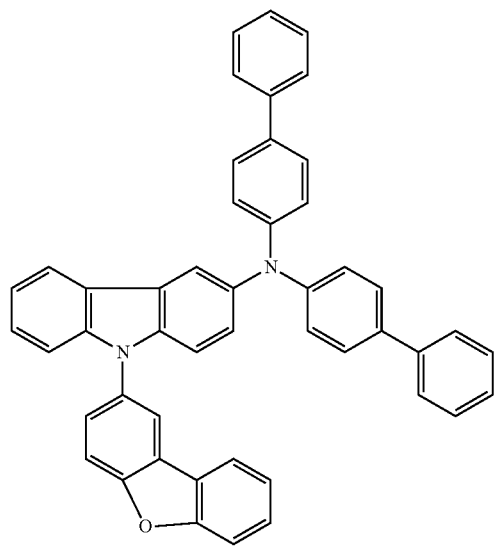
(2-6)
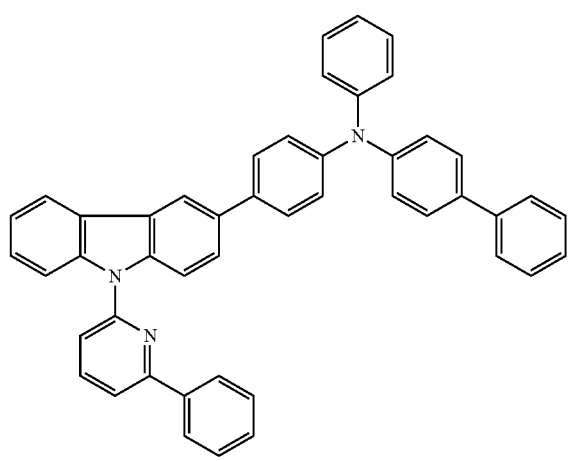
(2-7)
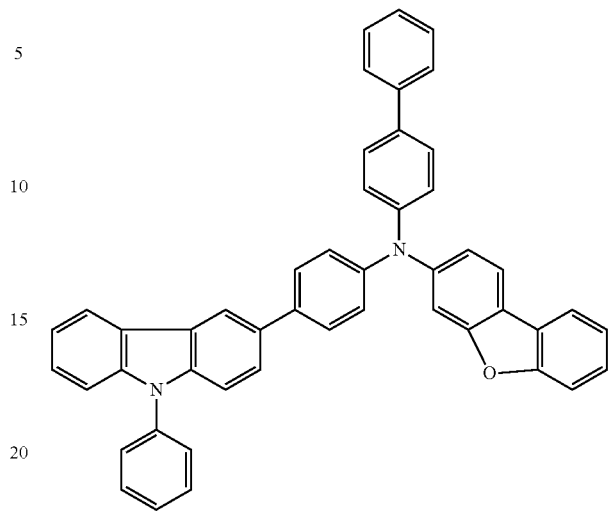
(2-8)
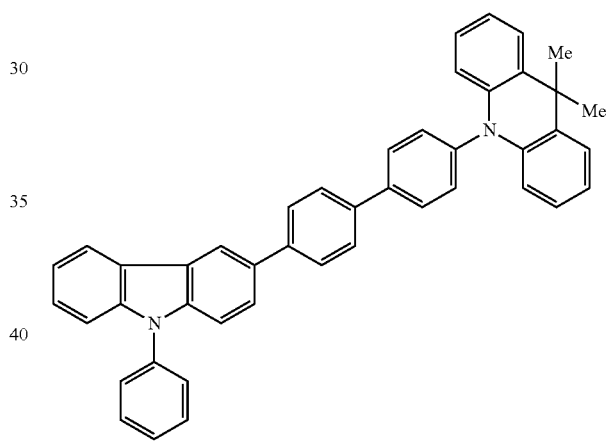
(2-9)
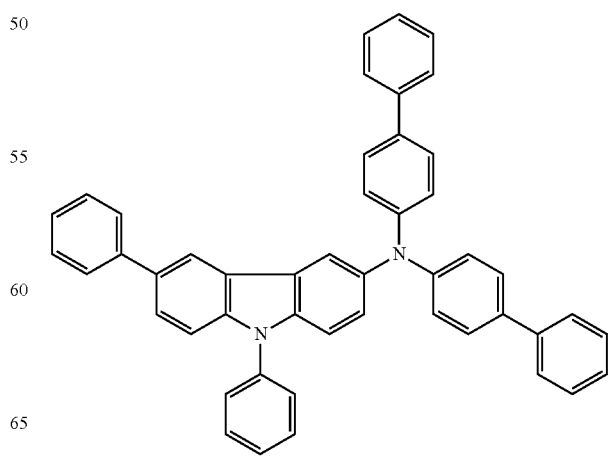

(2-10)
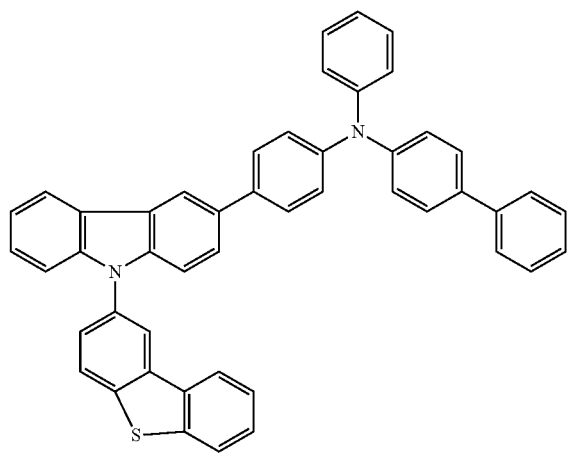
(2-11)
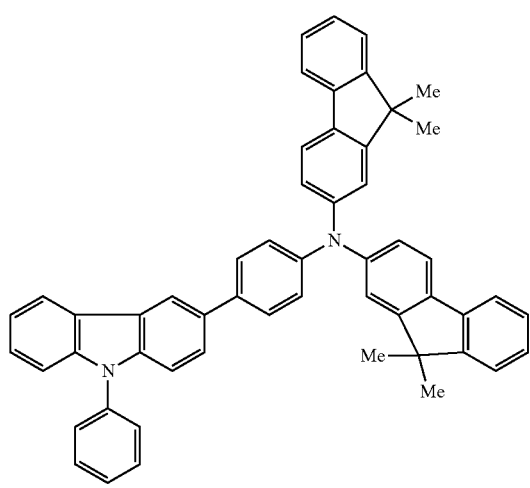
(2-12)
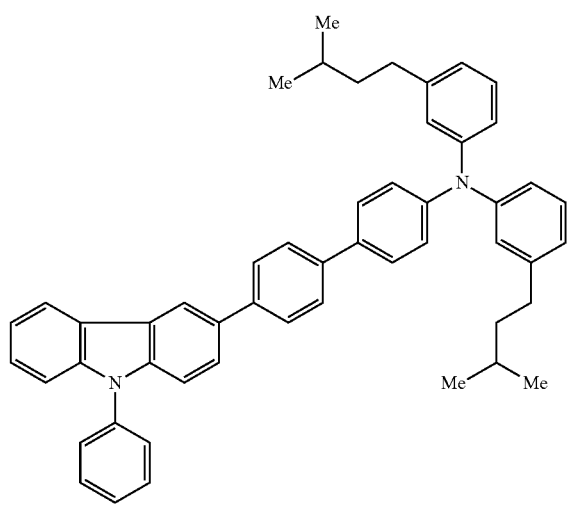
(2-13)
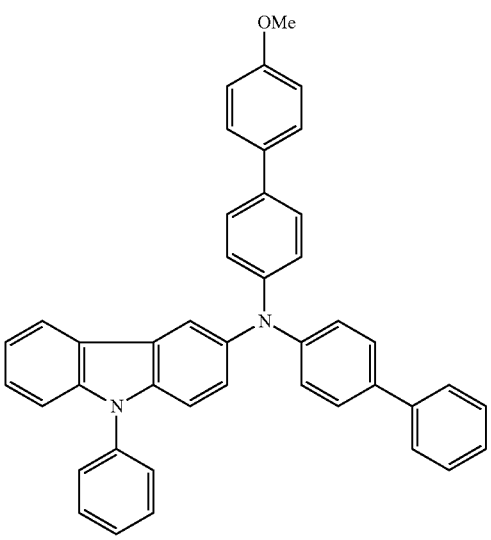
(2-14)
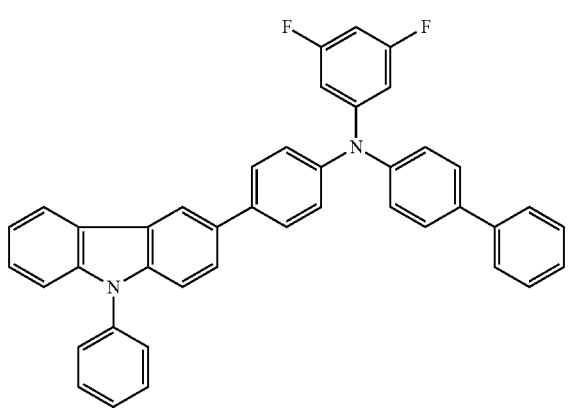
(2-15)
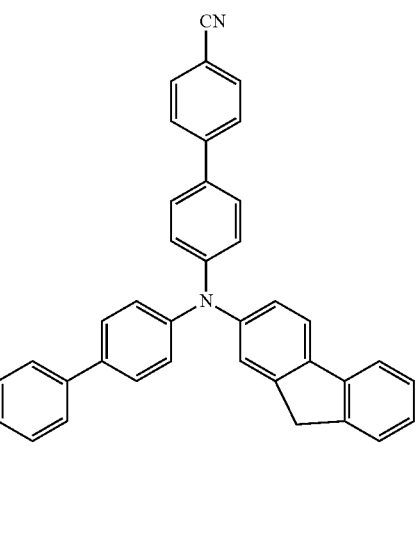

(2-16)

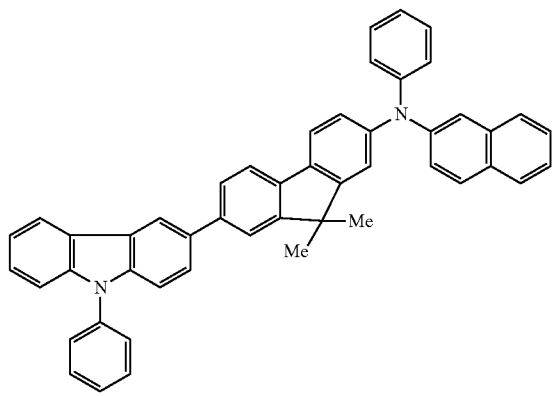

The intermediate hole transport material layer 133 may include the compound represented by the above General Formula (2), may help improve the hole transporting property of the hole transport layer 130, and may help improve the emission property of the organic electroluminescent device 100. For example, in the case that a carbazole derivative such as the compound represented by General Formula (2) is high in the hole transport layer 130, the emission life of the organic electroluminescent device 100 may be increased.

(2-1-1-3. Configuration of Emission Layer-Side Hole Transport Layer)

The emission layer-side hole transport layer 135 may include a compound represented by the following General Formula (1). The emission layer-side hole transport layer 135 may be formed, e.g., on the intermediate hole transport material layer 133, adjacent to the emission layer 140.

General Formula (1)

In the above General Formula (1), $Ar_1$ and $Ar_2$ may each independently be or include, e.g., a substituted or unsubstituted aryl group having 6 to 50 ring carbon atoms or a substituted or unsubstituted heteroaryl group having 5 to 50 ring carbon atoms. $Ar_3$ and $Ar_4$ may each independently be or include, e.g., a substituted or unsubstituted aryl group having 6 to 50 ring carbon atoms, a substituted or unsubstituted heteroaryl group having 5 to 50 ring carbon atoms, or a condensed polycyclic group formed via condensation with an adjacent aromatic ring. $R_1$ and $R_2$ may each independently be or include, e.g., a hydrogen atom, a deuterium atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms. $L_1$ and $L_2$ may each independently be or include, e.g., a direct linkage (e.g., a single bond), a substituted or unsubstituted arylene group having 6 to 18 ring carbon atoms or a substituted or unsubstituted heteroarylene group having 5 to 15 ring carbon atoms. m and n may each independently be, e.g., an integer of 0 to 4.

Examples of $Ar_1$ to $Ar_4$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a pyrazolyl group, a dibenzofuranyl group, a dibenzothienyl group, etc. In an implementation, $Ar_1$ to $Ar_4$ may include, e.g., the phenyl group, the biphenyl group, the terphenyl group, the fluorenyl group, the carbazolyl group, the dibenzofuranyl group, etc.

In an implementation, $Ar_3$ and $Ar_4$ may form a condensed ring with an adjacent aromatic ring. For example, $Ar_3$ and $Ar_4$ may each independently form a condensed ring via combination with the aromatic ring of an adjacent carbazolyl group. In an implementation, $Ar_3$ and $Ar_4$ may form a condensed ring via bonding together.

Examples of $R_1$ and $R_2$ (other than the hydrogen atom and the deuterium atom) may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a pyrazolyl group, a dibenzofuranyl group, a dibenzothienyl group, a methyl group, an ethyl group, a propyl group, an isopropyl group, a n-butyl group, etc. In an implementation, $R_1$ and $R_2$ may include, e.g., the hydrogen atom, the deuterium atom, the phenyl group, the biphenyl group, the terphenyl group, the fluorenyl group, the carbazolyl group, the dibenzofuranyl group, the methyl group, the ethyl group, etc.

Examples of $L_1$ and $L_2$ (other than the direct linkage) may include a substituent obtained by substituting the substituent illustrated in the above $Ar_1$ to $Ar_4$ with a divalent substituent. Examples of $L_1$ and $L_2$ (other than the direct linkage) may include the phenylene group, the naphthalene group, the biphenynylene group, the thienothiophenylene group and the pyridylene group. In an implementation, $L_1$ and $L_2$ may include, e.g., the direct linkage, the phenylene group, or the biphenynylene group.

Examples of the compound represented by General Formula (1) may include the following Compounds 1-1 to 1-22.

(1-1)

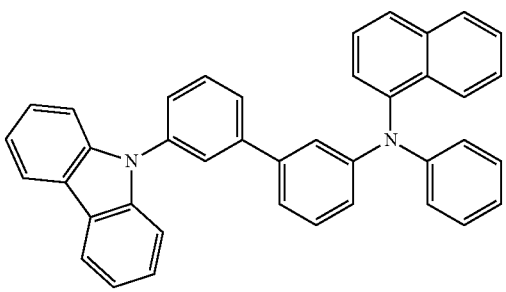

(1-2)
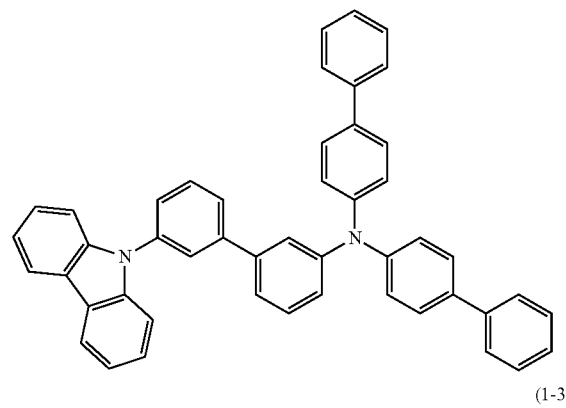
(1-3)
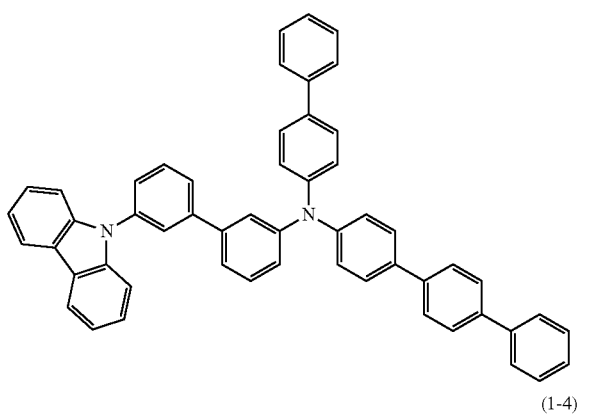
(1-4)
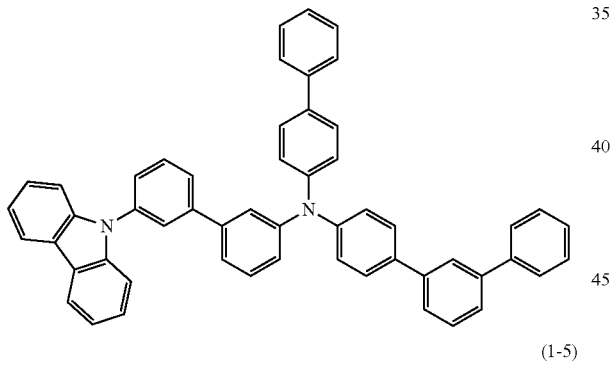
(1-5)
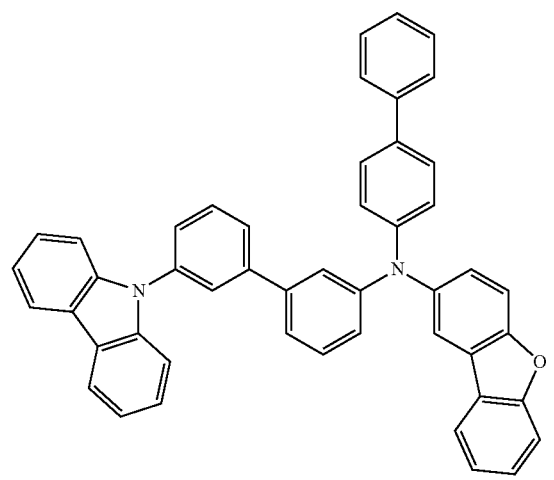
(1-6)
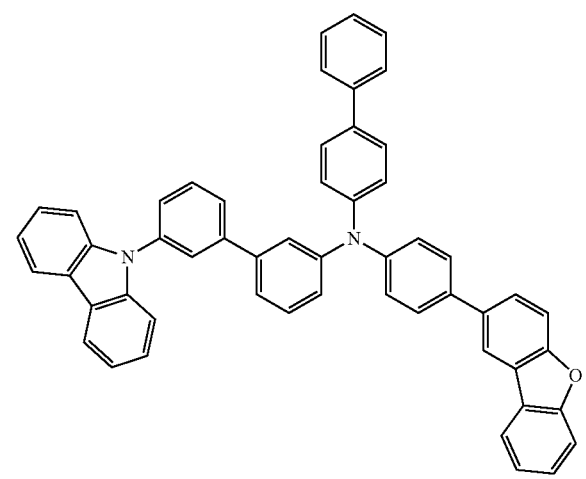
(1-7)
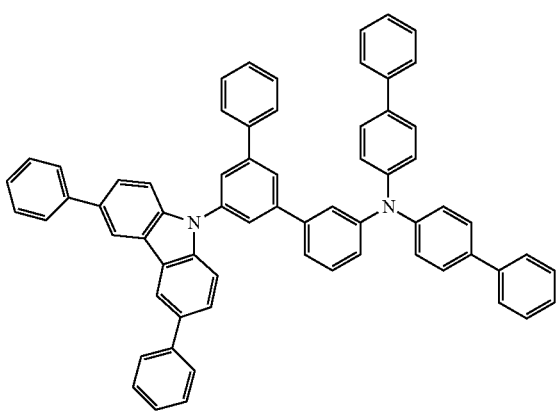
(1-8)

(1-9)
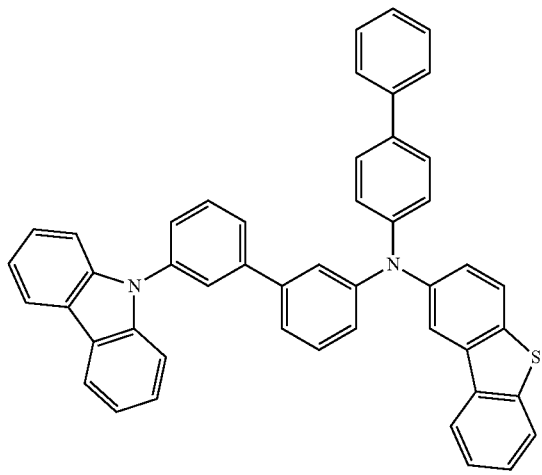
(1-10)
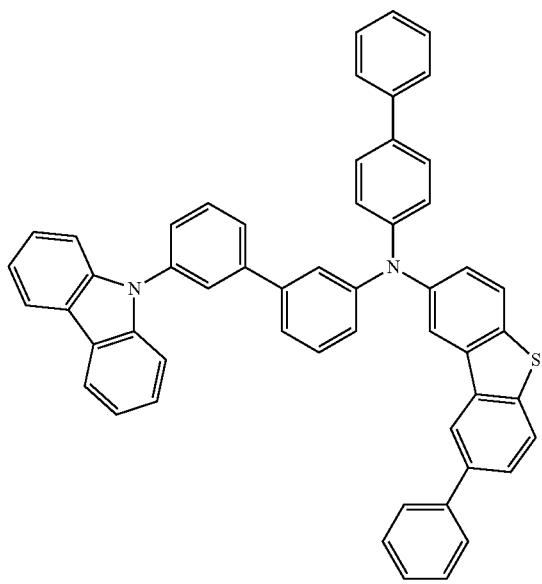
(1-11)
(1-12)
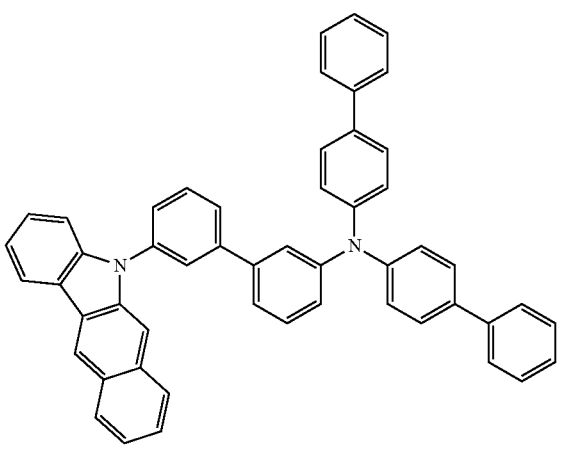
(1-13)
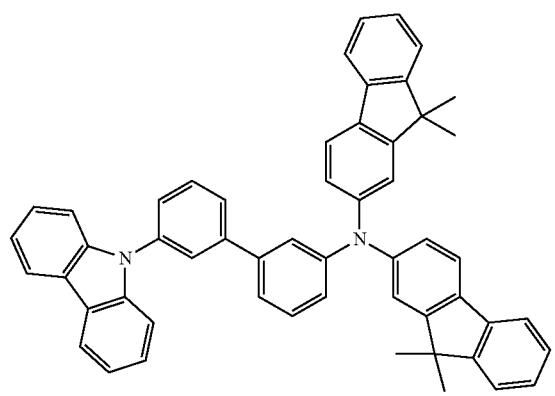
(1-14)
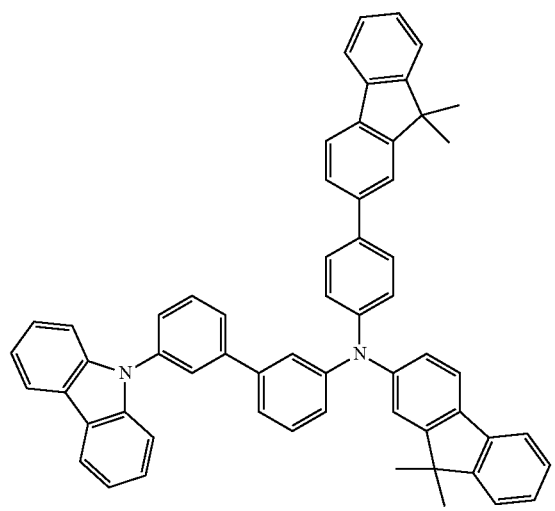

-continued
(1-15)
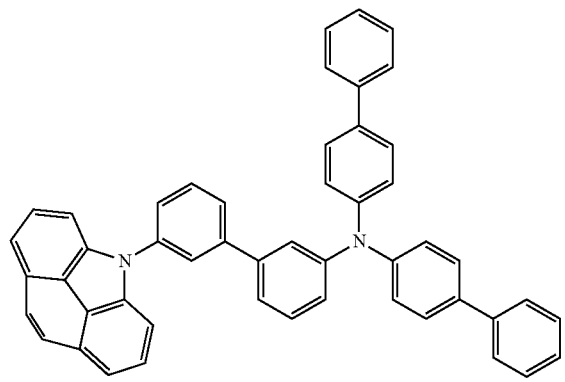
(1-16)
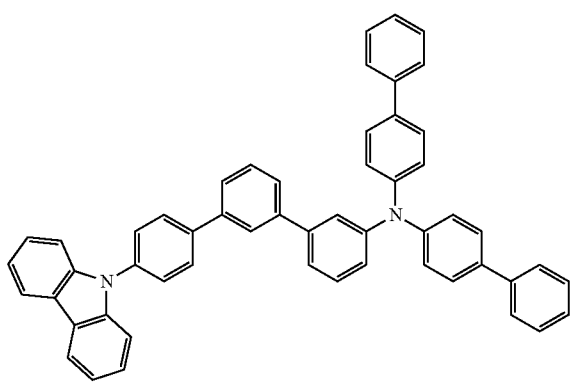
(1-17)
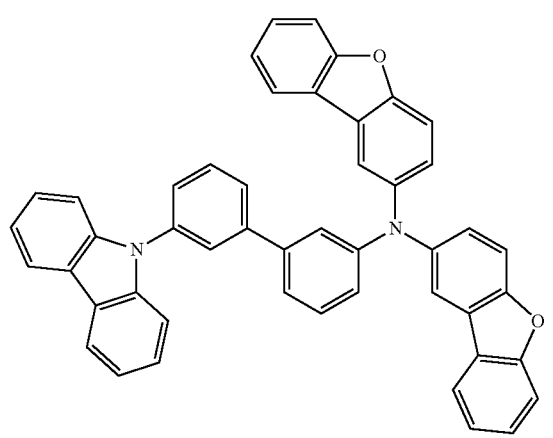
(1-18)
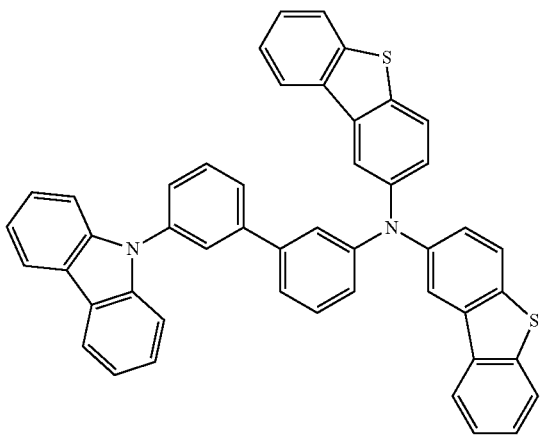
(1-19)
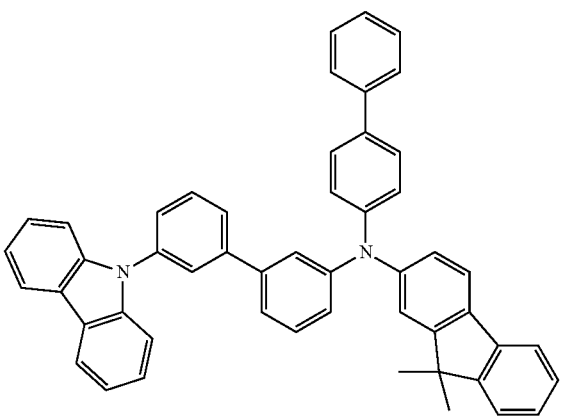
(1-20)
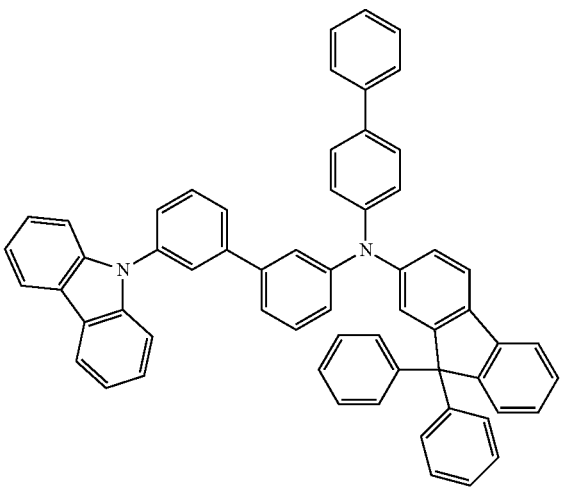

(1-21)

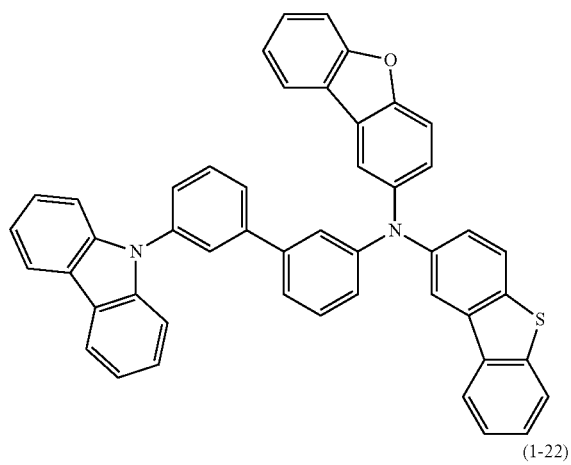

(1-22)

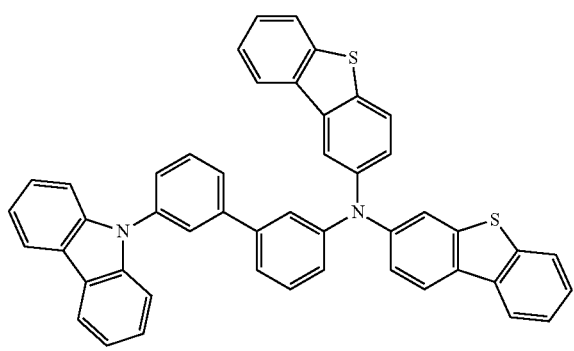

The emission layer-side hole transport layer 135 may include the compound represented by the above General Formula (1) as the emission layer-side hole transport material, and may help protect the hole transport layer 130 from electrons not consumed in the emission layer 140. In addition, the emission layer-side hole transport layer 135 may include the compound represented by the above General Formula (1), the diffusion of the energy of an excited state generated in the emission layer 140 to the hole transport layer 130 may be prevented. Thus, according to this configuration, the emission layer-side hole transport layer 135 may help improve the current flow durability of the hole transport layer 130.

In an implementation, the emission layer-side hole transport layer 135 may be formed around the emission layer 140. In an implementation, the emission layer-side hole transport layer 135 may be formed adjacent to, e.g., directly adjacent to, the emission layer 140 to effectively prevent the diffusion of electrons or energy from the emission layer 140.

In an implementation, the emission layer-side hole transport layer 135 may include the compound represented by the above General Formula (1), the charge balance of the whole organic electroluminescent device 100 may be controlled, and the diffusion of the electron accepting material included in the anode-side hole transport layer 131 into the emission layer 140 may be restrained. Accordingly, the emission layer-side hole transport layer 135 may help improve the charge transport property of the hole transport layer 130.

The emission layer-side hole transport layer 135 may include the compound represented by the above General Formula (1), and thus, the charge transport property and current flow durability of the hole transport layer 130 may be improved, and the emission efficiency and emission life of the organic electroluminescent device 100 may be improved.

As described above, the hole transport layer 130 including the anode-side hole transport layer 131, the intermediate hole transport material layer 133 and the emission layer-side hole transport layer 135 may help improve the current flow durability and hole transport property of the organic electroluminescent device 100. Thus, the organic electroluminescent device 100 according to an embodiment may have improved emission efficiency and emission life.

2-2. Examples

Hereinafter, the organic electroluminescent devices according to exemplary embodiments will be explained in particular referring to examples and comparative examples. In addition, the following embodiments are only for illustration, and the organic electroluminescent devices according to exemplary embodiments are not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

(2-2-1. Manufacture of Organic Electroluminescent Device Including Anode-Side Hole Transport Material Mainly Including Electron Accepting Material)

An organic electroluminescent device was manufactured by the following manufacturing method.

First, with respect to an ITO-glass substrate patterned and washed in advance, surface treatment using UV-Ozone ($O_3$) was conducted. In addition, the layer thickness of an ITO layer (first electrode) on a glass substrate was about 150 nm. After ozone treatment, the substrate was washed and inserted in a glass bell jar type evaporator for forming an organic layer, and an anode-side hole transport layer, an intermediate hole transport material layer, an emission layer-side hole transport layer, an emission layer and an electron transport layer were evaporated one by one with a vacuum degree of about $10^{-4}$ to about $10^{-5}$ Pa. The layer thickness of each of the anode-side hole transport layer, the intermediate hole transport material layer and the emission layer-side hole transport layer was about 10 nm. The layer thickness of the emission layer was about 25 nm, and the layer thickness of the electron transport layer was about 25 nm. Then, the substrate was moved into a glass bell jar type evaporator for forming a metal layer, and the electron injection layer and the second electrode were evaporated with a vacuum degree of about $10^{-4}$ to about $10^{-5}$ Pa. The layer thickness of the electron injection layer was about 1 nm and the layer thickness of the second electrode was about 100 nm.

Here, the anode-side hole transport layer, the intermediate hole transport material layer and the emission layer-side hole transport layer correspond to the hole transport layer with a stacked structure. The anode-side hole transport layer, the intermediate hole transport material layer and the emission layer-side hole transport layer were manufactured in the Examples and Comparative Examples using the materials shown in the following Table 2.

In addition, Compounds 6-1 and 6-2 are hole transport materials represented by the following formulae, and "-" means that a corresponding layer was not formed.

[Formula 13]

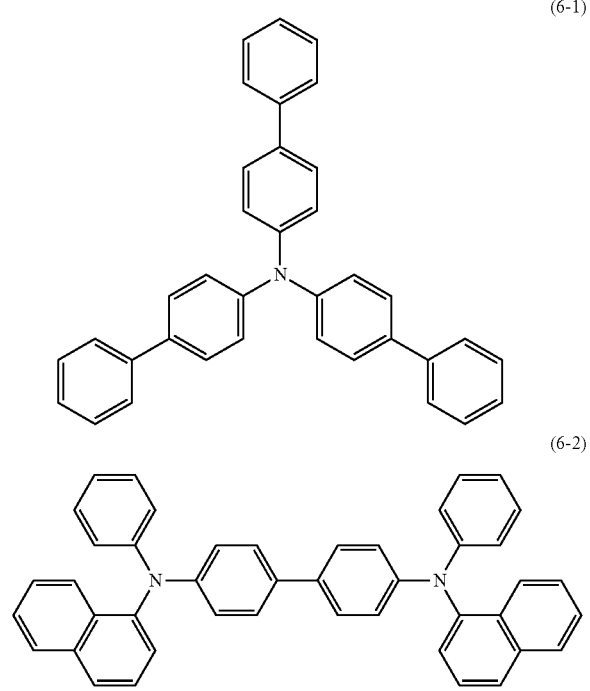

In addition, the electron transport layer was formed using Alq3, the electron injection layer was formed using LiF, and the second electrode was formed using aluminum (Al).

(2-2-2. Evaluation Results)

Then, the driving voltage, the emission efficiency, and the half life of the organic electroluminescent device thus manufactured were evaluated. The evaluation results are shown together in the following Table 2. The driving voltage and the emission efficiency in each Example and Comparative Example were obtained by measuring with current density of about 10 mA/cm$^2$. In addition, the half life was obtained by measuring luminance with the initial luminance of about 1,000 cd/m$^2$.

In addition, the measurement was conducted using a source meter of 2400 series of Keithley Instruments Co., Color brightness photometer CS-200 (Konica Minolta holdings, measurement angle of 1°), and a PC program LabVIEW8.2 (National instruments in Japan) for measurement in a dark room.

[Formula 14]

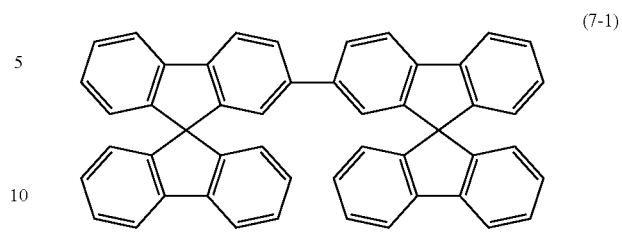

TABLE 2

|  | Anode-side hole transport layer | Intermediate hole transport material layer | Emission layer-side hole transport layer | Host material | Driving voltage [V] | Emission efficiency [cd/A] | Half life [hr] |
|---|---|---|---|---|---|---|---|
| Example 2-1 | Compound 4-15 | Compound 2-3 | Compound 1-2 | Compound 3-2 | 6.4 | 7.6 | 3,400 |
| Example 2-2 | Compound 4-15 | Compound 6-2 | Compound 1-2 | Compound 3-2 | 6.5 | 7.6 | 3,300 |
| Example 2-3 | Compound 4-15 | Compound 6-2 | Compound 1-2 | Compound 7-1 | 7.0 | 7.4 | 2,900 |
| Comparative Example 2-1 | Compound 4-15 | Compound 1-2 | Compound 2-3 | Compound 3-2 | 6.7 | 6.4 | 1,900 |
| Comparative Example 2-2 | Compound 1-2 | Compound 4-15 | Compound 1-2 | Compound 3-2 | 6.7 | 6.6 | 2,400 |
| Comparative Example 2-3 | Compound 4-15 | Compound 2-3 | Compound 6-1 | Compound 3-2 | 6.5 | 7.3 | 2,400 |
| Comparative Example 2-4 | — | Compound 2-3 | Compound 1-2 | Compound 3-2 | 8.0 | 6.1 | 1,600 |

In addition, in Examples 2-1 to 2-2 and Comparative Examples 2-1 to 2-4, ADN (Compound 3-2) was used as the host material of the emission layer, and TBP was used as a dopant material. In Example 2-3, 2-(9,9-spirobifluorene-2-yl)-9,9-spirobifluorene (Compound 7-1) was used as the host material of the emission layer, and TBP was used as the dopant material. In addition, the dopant material was added in an amount ratio of about 3 wt % on the basis of the amount of the host material.

Here, Compound 7-1 is a compound represented by the following formula and is a host material for an emission layer.

Referring to the results in Table 2, the emission efficiency was increased for the organic electroluminescent devices of Examples 2-1 to 2-3, when compared to those of Comparative Examples 2-1 to 2-4. For example, when comparing Examples 2-1 to 2-3 with Comparative Example 2-4 (not including an anode-side hole transport layer including mainly an electron accepting material), the properties of Examples 2-1 to 2-3 were good. Thus, it may be seen that the emission efficiency and emission life of the organic electroluminescent device were improved by providing three layers of the anode-side hole transport layer, the intermediate hole transport material layer, and the emission layer-side hole transport layer between the first electrode and the emission layer.

When comparing Example 2-1 with Comparative Example 2-3, the properties of Example 2-1 were good. In Comparative Example 2-3, another hole transport material, Compound 6-1 was used in the emission layer-side hole transport material included in the emission layer-side hole transport layer, instead the compound represented by General Formula (1). Thus, it may be seen that the inclusion of the compound represented by General Formula (1) in the emission layer-side hole transport layer would be desirable.

In addition, when comparing Example 2-1 with Comparative Example 2-1, the properties of Example 2-1 were good. In Comparative Example 2-2, the compounds included in the intermediate hole transport material and the emission layer-side hole transport material layer were changed from the compound included in Example 2-1. Thus, it may be seen that the provision of the emission layer-side hole transport layer including the compound represented by General Formula (1) adjacent to the emission layer would be desirable.

In addition, when comparing Example 2-1 with Comparative Example 2-2, the properties of Example 2-1 were good. In Comparative Example 2-2, a layer formed using mainly the electron accepting material, Compound 4-15 was inserted between layers including Compound 1-2 represented by General Formula (1), and was provided at a position corresponding to the intermediate hole transport material layer. Thus, the provision of the anode-side hole transport layer including mainly the electron accepting material near the first electrode (anode) would be desirable.

In addition, when comparing Example 2-1 with Example 2-2, the properties of Examples 2-1 and 2-2 were good. In Example 2-2, a hole transport material, Compound 6-2, was used in the intermediate hole transport material included in the intermediate hole transport material layer, instead of Compound 2-3 represented by General Formula (2). Thus, it may be seen that the compound represented by General Formula (2) may be included in the intermediate hole transport material layer.

In addition, when comparing Example 2-1 and 2-2 with Example 2-3, the properties of Examples 2-1 to 2-3 were good. In Example 2-3, a host material of an emission layer, Compound 7-1, was used as the host material of the emission layer, instead of Compound 3-2 represented by General Formula (3). Thus, it may be seen that the compound represented by General Formula (3) may be included as the host material or dopant material.

As described above, according to exemplary embodiments, the anode-side hole transport layer including mainly the electron accepting material, the intermediate hole transport material layer, and the emission layer-side hole transport layer including the compound represented by General Formula (1) may be stacked between the first electrode (anode) and the emission layer, the emission life of the organic electroluminescent device may be increased.

By way of summation and review, techniques on a hole transport material or a hole transport layer in the organic electroluminescent device may be performed. For example, a hole transport material including a carbazolyl group may be used in a hole transport layer. An electron accepting material may be added in the hole transport layer, etc. A hole transport layer may be formed as a stacked structure of multiple layers.

It may be thought that by disposing the emission layer-side hole transport layer including the compound represented by General Formula (1), the emission layer-side hole transport layer may protect the hole transport layer from electrons not consumed in the emission layer and may help prevent the diffusion of excited state energy generated in the emission layer into the hole transport layer, thereby controlling the charge balance of the whole device. In addition, it may be thought that by disposing the emission layer-side hole transport layer including the compound represented by General Formula (1), the emission layer-side hole transport layer may help restrain the diffusion of the electron accepting material included in the anode-side hole transport layer provided near the first electrode (anode) into the emission layer.

Satisfactory values concerning the emission efficiency and emission life of an organic electroluminescent device may be desirable.

The embodiments may provide a novel and improved organic electroluminescent device having improved emission efficiency and emission life.

As described above, according to an embodiment, an anode-side hole transport layer, an intermediate hole transport material layer and an emission layer-side hole transport layer may be provided between an anode and an emission layer, and the emission efficiency and emission life of an organic electroluminescent device may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescent device, comprising:
   an anode;
   an emission layer;
   an anode-side hole transport layer between the anode and the emission layer, the anode-side hole transport layer:
   including an anode-side hole transport material, and
   being doped with an electron accepting material;
   an intermediate hole transport material layer between the anode-side hole transport layer and the emission layer, the intermediate hole transport material layer including an intermediate hole transport material; and
   an emission layer-side hole transport layer between the intermediate hole transport material layer and the emission layer and adjacent to the emission layer, the emission layer-side hole transport layer including an emission layer-side hole transport material represented by the following General Formula (1):

General Formula (1)

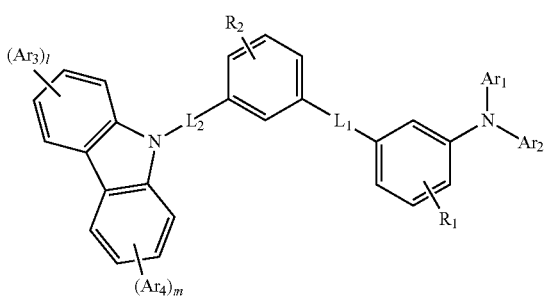

wherein, in General Formula (1),

Ar₁ and Ar₂ are each independently a substituted or unsubstituted aryl group having 6 to 50 ring carbon atoms or a substituted or unsubstituted heteroaryl group having 5 to 50 ring carbon atoms, Ar₃ and Ar₄ are each independently a substituted or unsubstituted aryl group having 6 to 50 ring carbon atoms, a substituted or unsubstituted heteroaryl group having 5 to 50 ring carbon atoms, or a condensed polycyclic group formed via condensation with an adjacent ring, R₁ and R₂ are each independently a hydrogen atom, a deuterium atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, L₁ and L₂ are each independently a single bond, a substituted or unsubstituted arylene group having 6 to 18 ring carbon atoms, or a substituted or unsubstituted heteroarylene group having 5 to 15 ring carbon atoms, and l and m are each independently an integer of 0 to 4.

2. The organic electroluminescent device as claimed in claim 1, wherein the intermediate hole transport material includes a compound represented by the following General Formula (2):

General Formula (2)

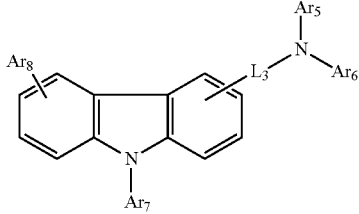

wherein, in General Formula (2),

Ar₅ to Ar₇ are each independently a substituted or unsubstituted aryl group having 6 to 50 ring carbon atoms or a substituted or unsubstituted heteroaryl group having 5 to 50 ring carbon atoms, Ar₈ is a hydrogen atom, a deuterium atom, a halogen atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, and L₃ is a direct linkage, a substituted or unsubstituted arylene group having 6 to 18 ring carbon atoms, or a substituted or unsubstituted heteroarylene group having 5 to 15 ring carbon atoms.

3. The organic electroluminescent device as claimed in claim 1, wherein the electron accepting material has a lowest unoccupied molecular orbital (LUMO) level of about −9.0 eV to about −4.0 eV.

4. The organic electroluminescent device as claimed in claim 1, wherein the anode-side hole transport layer is adjacent to the anode.

5. The organic electroluminescent device as claimed in claim 1, wherein the anode-side hole transport material includes a compound represented by the following General Formula (2)

General Formula (2)

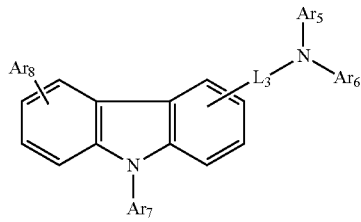

wherein, in General Formula (2),

Ar₅ to Ar₇ are each independently a substituted or unsubstituted aryl group having 6 to 50 ring carbon atoms or a substituted or unsubstituted heteroaryl group having 5 to 50 ring carbon atoms, Ar₈ is a hydrogen atom, a deuterium atom, a halogen atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, and L₃ is a direct linkage, a substituted or unsubstituted arylene group having 6 to 18 ring carbon atoms, or a substituted or unsubstituted heteroarylene group having 5 to 15 ring carbon atoms.

6. The organic electroluminescent device as claimed in claim 1, wherein the emission layer includes a compound represented by the following General Formula (3):

General Formula (3)

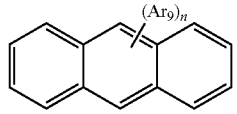

wherein, in General Formula (3), each Ar₉ is independently a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group or a hydroxyl group, and n is an integer of 1 to 10.

7. An organic electroluminescent device, comprising:
an anode;
an emission layer;
an anode-side hole transport layer between the anode and the emission layer, the anode-side hole transport layer mainly including an electron accepting material;
an intermediate hole transport material layer between the anode-side hole transport layer and the emission layer, the intermediate hole transport material layer including an intermediate hole transport material; and
an emission layer-side hole transport layer between the intermediate hole transport material layer and the emission layer and adjacent to the emission layer, the emission layer-side hole transport layer including an emission layer-side hole transport material represented by the following General Formula (1):

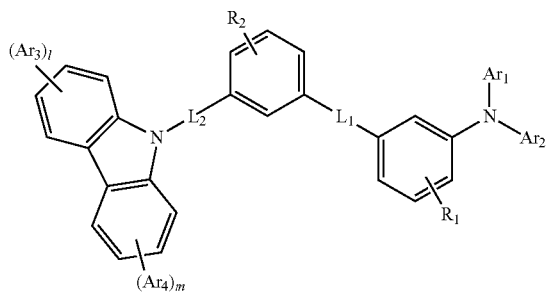

General Formula (1)

wherein, in General Formula (1), $Ar_1$ and $Ar_2$ are each independently a substituted or unsubstituted aryl group having 6 to 50 ring carbon atoms or a substituted or unsubstituted heteroaryl group having 5 to 50 ring carbon atoms, $Ar_3$ and $Ar_4$ are each independently a substituted or unsubstituted aryl group having 6 to 50 ring carbon atoms, a substituted or unsubstituted heteroaryl group having 5 to 50 ring carbon atoms, or a condensed polycyclic group formed via condensation with an adjacent ring, $R_1$ and $R_2$ are each independently a hydrogen atom, a deuterium atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, $L_1$ and $L_2$ are each independently a single bond, a substituted or unsubstituted arylene group having 6 to 18 ring carbon atoms, or a substituted or unsubstituted heteroarylene group having 5 to 15 ring carbon atoms, and l and m are each independently an integer of 0 to 4.

8. The organic electroluminescent device as claimed in claim 7, wherein the intermediate hole transport material includes a compound represented by the following General Formula (2):

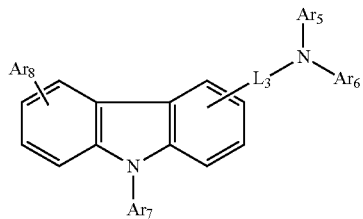

General Formula (2)

wherein, in General Formula (2), $Ar_5$ to $Ar_7$ are each independently a substituted or unsubstituted aryl group having 6 to 50 ring carbon atoms or a substituted or unsubstituted heteroaryl group having 5 to 50 ring carbon atoms, $Ar_8$ is a hydrogen atom, a deuterium atom, a halogen atom, a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, and $L_3$ is a direct linkage, a substituted or unsubstituted arylene group having 6 to 18 ring carbon atoms, or a substituted or unsubstituted heteroarylene group having 5 to 15 ring carbon atoms.

9. The organic electroluminescent device as claimed in claim 7, wherein the electron accepting material has a lowest unoccupied molecular orbital (LUMO) level of about −9.0 eV to about −4.0 eV.

10. The organic electroluminescent device as claimed in claim 7, wherein the anode-side hole transport layer is adjacent to the anode.

11. The organic electroluminescent device as claimed in claim 7, wherein the emission layer includes a compound represented by the following General Formula (3):

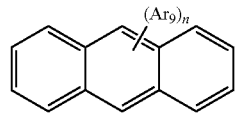

General Formula (3)

wherein, in General Formula (3), each $Ar_9$ is independently a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group or a hydroxyl group, and n is an integer of 1 to 10.

* * * * *